(12) United States Patent
Chen et al.

(10) Patent No.: US 12,341,060 B2
(45) Date of Patent: Jun. 24, 2025

(54) METHOD FOR MANUFACTURING THROUGH VIAS USING AMORPHIZATION TO ADJUST ETCHING RATE

(71) Applicant: TAIWAN SEMICONDUCTOR MANUFACTURING COMPANY LTD., Hsinchu (TW)

(72) Inventors: Ching Kang Chen, Kaohsiung (TW); Kun-Ei Chen, Tainan County (TW); Chen-Chieh Chiang, Kaohsiung (TW); Ling-Sung Wang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 405 days.

(21) Appl. No.: 17/724,210

(22) Filed: Apr. 19, 2022

(65) Prior Publication Data

US 2023/0335390 A1    Oct. 19, 2023

(51) Int. Cl.
*H01L 21/768*    (2006.01)
*H01L 21/02*    (2006.01)
*H01L 21/306*    (2006.01)
*H01L 23/485*    (2006.01)

(52) U.S. Cl.
CPC .. *H01L 21/76825* (2013.01); *H01L 21/02112* (2013.01); *H01L 21/30604* (2013.01); *H01L 21/76813* (2013.01); *H01L 21/76816* (2013.01); *H01L 21/76877* (2013.01); *H01L 23/485* (2013.01)

(58) Field of Classification Search
CPC ............ H01L 21/02107; H01L 21/302; H01L 21/311; H01L 21/31155; H01L 21/76811; H01L 21/76813; H01L 21/76816; H01L 21/76825; H01L 21/76877; H01L 23/485
See application file for complete search history.

(56) References Cited

U.S. PATENT DOCUMENTS

| | | | |
|---|---|---|---|
| 6,620,729 B1* | 9/2003 | May | H01L 21/31111 257/E21.257 |
| 2012/0299115 A1* | 11/2012 | Chuang | H01L 29/0649 257/E21.546 |
| 2016/0155672 A1* | 6/2016 | Liu | H01L 29/66636 438/585 |
| 2016/0172466 A1* | 6/2016 | Wang | H01L 21/823878 438/217 |

* cited by examiner

*Primary Examiner* — Herve-Louis Y Assouman
*Assistant Examiner* — Christopher M Roland
(74) *Attorney, Agent, or Firm* — WPAT LAW; Anthony King

(57) ABSTRACT

A method for manufacturing a semiconductor structure is provided. The method may include several operations. A first layer is formed over a first region and a second region of a substrate. A first etching is performed on the first layer, thereby forming a first trench in the first region and a second trench in the second region. A first amorphization is performed on the first layer in the second region. A second etching is performed on the first layer, wherein an etching rate of the second etching in the second region is greater than an etching rate of the second etching in the first region.

20 Claims, 28 Drawing Sheets

METHOD FOR MANUFACTURING THROUGH VIAS USING AMORPHIZATION TO ADJUST ETCHING RATE

BACKGROUND

Semiconductor devices are used in a variety of electronic applications, such as personal computers, cellular phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of precise control of etching rates across a wafer have arisen.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
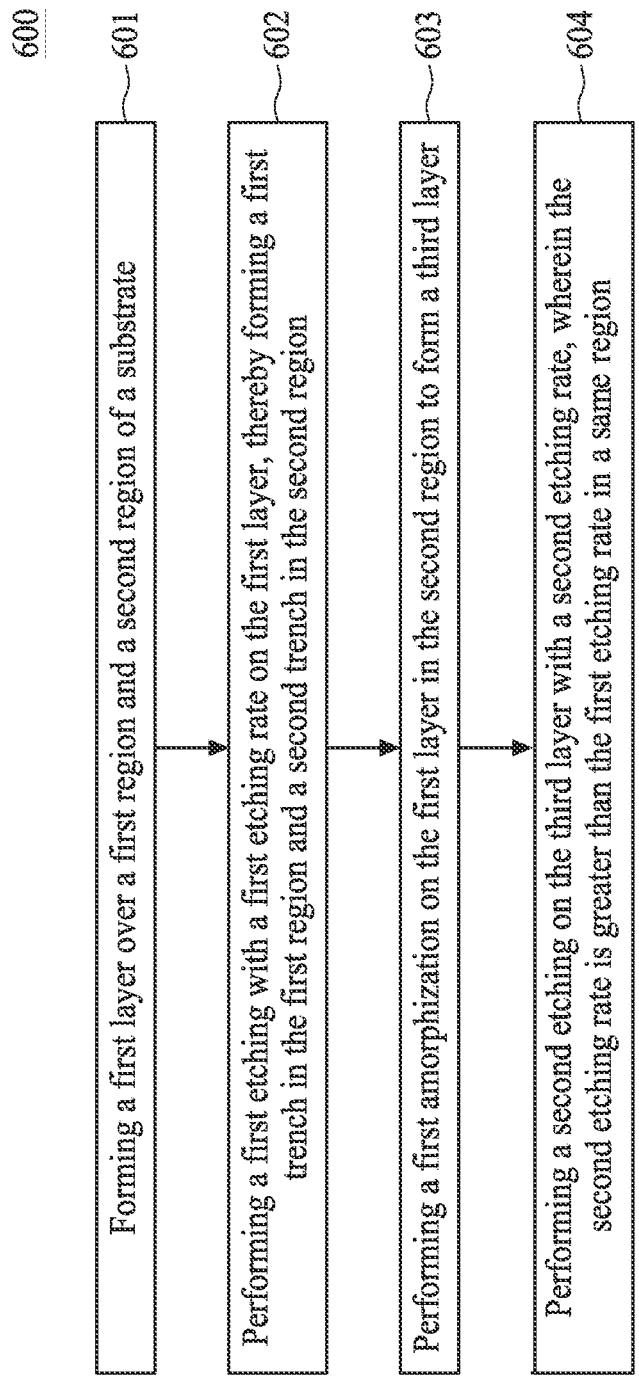
FIG. 1 is a flow diagram of a method for manufacturing a semiconductor structure in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a flow diagram of a method 600 for manufacturing a semiconductor structure in accordance with some embodiments of the present disclosure. The method 600 includes a number of operations (601, 602, 603 and 604) and the description and illustration are not deemed as a limitation to the sequence of the operations. A first layer is formed over a substrate in a first region and a second region in the operation 601. A first etching with a first etching rate is performed on the first layer in the operation 602, thereby forming a first trench in the first region and a second trench in the second region. An amorphization 51 is performed on the first layer in the second region to form a third layer in the operation 603, wherein the amorphization 51 targets a bottom of the second trench. A second etching is performed on the third layer with a second etching rate in the operation 604, wherein the second etching rate is greater than the first etching rate. It should be noted that the operations of the method 600 may be rearranged or otherwise modified within the scope of the various aspects. Additional processes may be provided before, during, and after the method 600, and some other processes may be only briefly described herein. Thus, other implementations are possible within the scope of the various aspects described herein.

Figure 2:
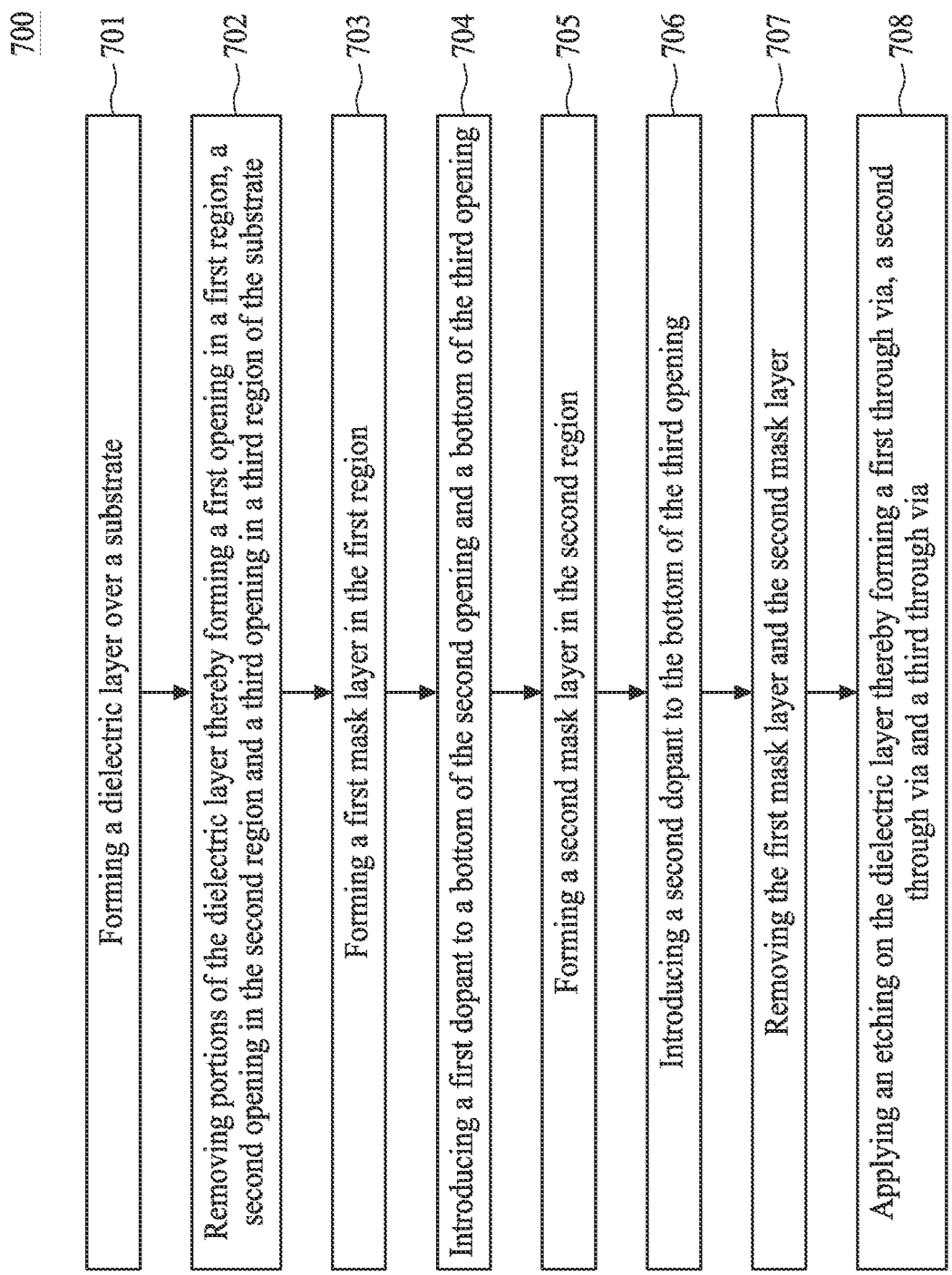
FIG. 2 is a flow diagram of a method for manufacturing a semiconductor structure in accordance with some embodiments of the disclosure.

FIG. 2 is a flow diagram of a method 700 for manufacturing a semiconductor structure in accordance with some embodiments of the present disclosure. The method 700 includes a number of operations (701, 702, 703, 704, 705, 706, 707 and 708) and the description and illustration are not deemed as a limitation to the sequence of the operations. A dielectric layer is formed over a substrate in the operation 701. Portions of the dielectric layer are removed in the operation 702, thereby forming a first opening in a first region, a second opening in a second region and a third opening in a third region. A first mask layer is formed in the first region in the operation 703 to cover the first opening. A first dopant is introduced to a bottom of the second opening and a bottom of the third opening in the operation 704. A second mask layer is formed in the second region in the operation 705 to cover the second opening. A second dopant is introduced to the bottom of the third opening in the operation 706. The first mask layer and the second mask layer are removed in the operation 707. The dielectric layer is etched in the operation 708, thereby forming a first through via, a second through via, and a third through via penetrating the dielectric layer. It should be noted that the operations of the method 700 may be rearranged or otherwise modified within the scope of the various aspects. Additional processes may be provided before, during, and after the method 700, and some other processes may be only briefly described herein. Thus, other implementations are possible within the scope of the various aspects described herein.

The method 600 and the method 700 are within the same concept of the present disclosure, and in order to further illustrate details of the method 600, the method 700, and the concept of the present disclosure, the method 600 and the method 700 are comprehensively illustrated with embodiments of the present disclosure.

Figure 3:
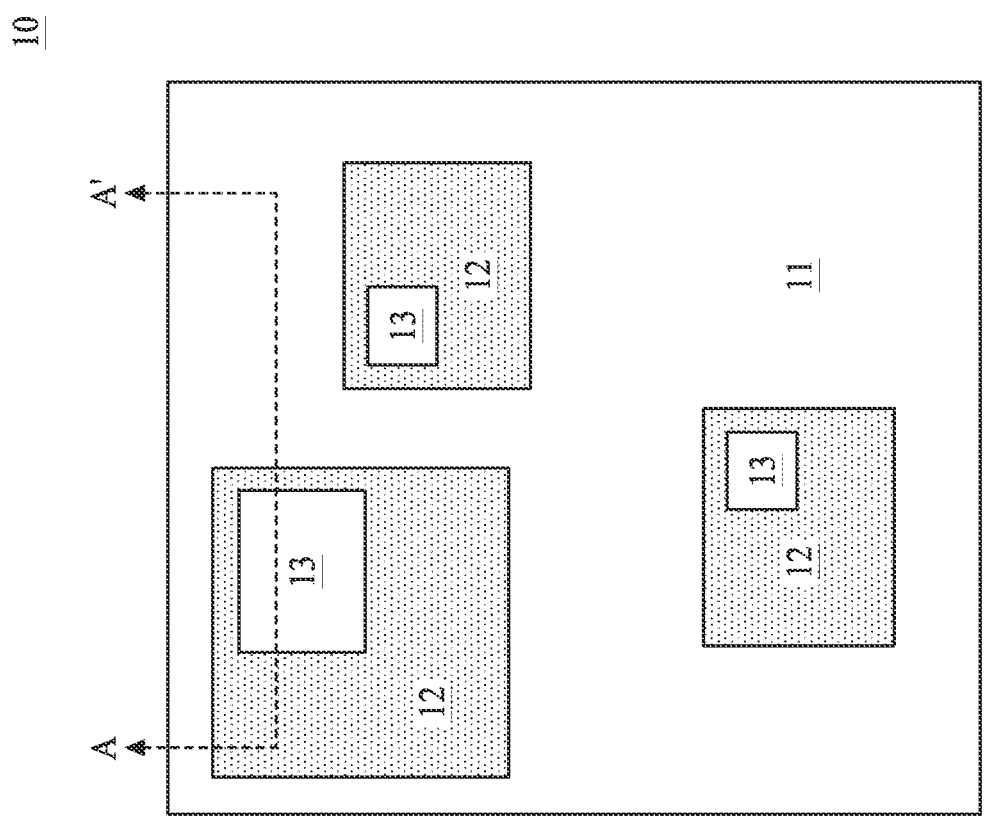
FIG. 3 is a schematic top view of a semiconductor structure in accordance with some embodiments of the disclosure.

Please refer to FIG. 3, which is a schematic diagram of a semiconductor structure 10 from a top view perspective in accordance with some embodiments of the present disclosure. The semiconductor structure 10 can be a die, a chip, or an active area of a wafer. The semiconductor structure 10 may include multiple regions. In some embodiments as shown in FIG. 3, the semiconductor structure 10 includes a first region 11, a second region 12, and a third region 13. In some embodiments, the first region 11, the second region 12 and the third region 13 have different densities of active components. In some embodiments, the active components include transistors. In some embodiments, the first region 11, the second region 12 and the third region 13 have different densities of electric paths. In some embodiments, a greater density of electric paths includes a greater density of conductive components of an interconnect structure. In some embodiments, a distance between adjacent conductive components of the interconnect structure decreases as a density of electric paths increases.

Figure 4:
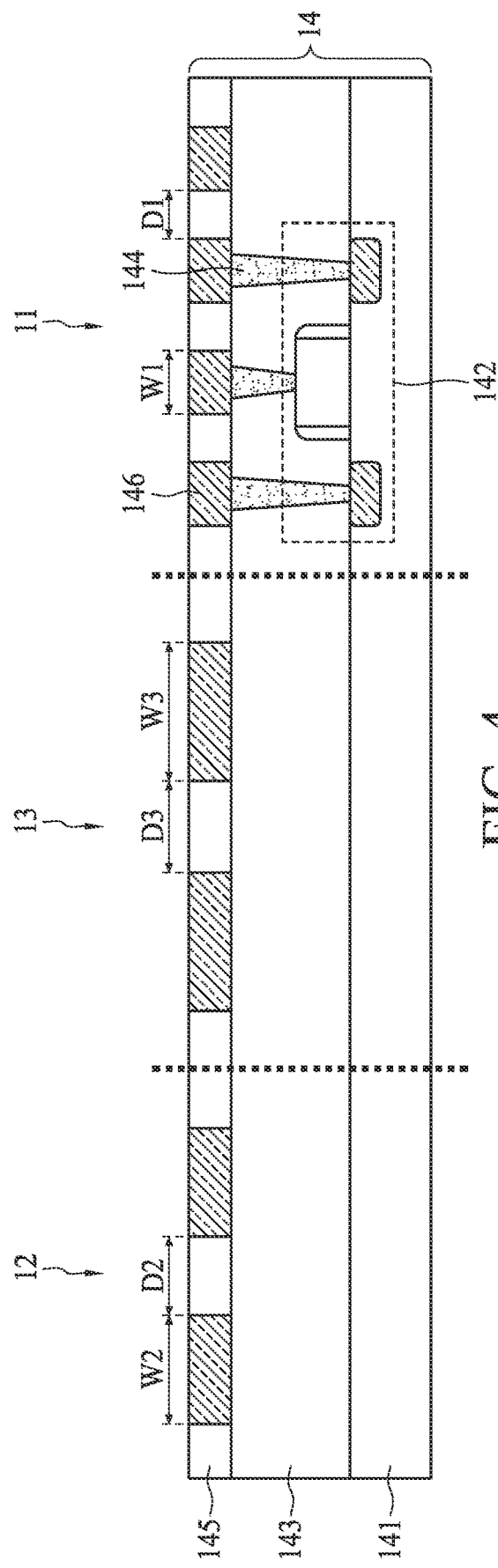
FIGS. 4 to 8 are schematic diagrams at different stages of a method for manufacturing a semiconductor structure in accordance with different embodiments of the disclosure.

Please refer to FIG. 4, which is a schematic cross-sectional diagram along a line A-A' of the semiconductor structure 10 shown in FIG. 3 at a stage of the method 600 or the method 700 in accordance with some embodiments of the present disclosure. Prior to the operation 601 or the operation 701, a substrate 14 is provided, received, or formed. In some embodiments, the substrate 14 includes a plurality of electrical components 142 formed on a semiconductive layer 141. The semiconductive layer 141 (which may be referred to as a die substrate) includes a bulk semiconductor material, such as silicon. In one embodiment, the substrate 14 may include other semiconductor materials, such as silicon germanium, silicon carbide, gallium arsenide, or the like. The semiconductive layer 141 may be of a first conductivity type, e.g., a P-type semiconductive substrate (acceptor type), or of a second conductivity type, e.g., an N-type semiconductive substrate (donor type).

Alternatively, the semiconductive layer 141 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In another embodiment, the semiconductive layer 141 may be a semiconductor-on-insulator (SOI). In still other embodiments, the semiconductive layer 141 may include a doped epitaxial layer, a gradient semiconductor layer, or a semiconductor layer overlaying another semiconductor layer of a different type, such as a silicon layer on a silicon germanium layer.

The plurality of electrical components 142 are formed on the semiconductive layer 141 following conventional methods of manufacturing semiconductors. The electrical components 142 can be active components or devices, and may include different types or generations of devices. The electrical components 142 can include a planar transistor, a multi-gate transistor, a gate-all-around field-effect transistor (GAAFET), a fin field-effect transistor (FinFET), a vertical transistor, a nanosheet transistor, a nanowire transistor, or a combination thereof. For a purpose of simplicity, a planar transistor is depicted in FIG. 4 as an exemplary embodiment of an electrical component, but such depiction is not intended to limit the present disclosure.

The substrate 14 may further include an insulating layer 143 formed over the semiconductive layer 141, and a plurality of contacts 144 formed in the insulating layer 143 and electrically connected to the electrical components 142. In some embodiments, the contacts 144 are connected to a source region, a drain region and a gate region of a transistor (which can be one of the electrical components 142). In some embodiments, the first region 11, the second region 12, and the third region 13 are defined by different densities of electrical components 142. In some embodiments, a first density of the electrical components 142 in the first region 11 is greater than a second density of the electrical components 142 in the second region 12. In some embodiments, the second density of the electrical components 142 in the second region 12 is greater than a third density of the electrical components 142 in the third region 13.

The substrate 14 may further include a plurality of conductive elements 146. In some embodiments, the conductive elements 146 are electrically isolated by an insulating layer 145. In some embodiments, a material of the conductive elements 146 includes copper (Cu), aluminum (Al), tungsten (W), manganese (Mn), cobalt (Co), titanium (Ti), or a combination thereof. In some embodiments, the insulating layer 145 includes silicon oxide, silicon nitride, silicon oxy-nitride, a low-k dielectric material, a high-k dielectric material, combinations thereof, and/or other suitable materials. The conductive elements 146 may be a layer of silicides, pads, traces, vias, plugs, plates, or contacts, or a layer having a combination thereof. In some embodiments as shown in FIG. 4, the conductive elements 146 are electrically connected to the contacts 144. In some embodiments, the conductive elements 146 collectively comprise a first conductive layer formed above the contacts 144. The conductive elements 146 can be comprehensively referred to as a first conductive layer of an interconnect structure. In some embodiments, the conductive elements 146 are disposed in another layer above the first conductive layer of the interconnect structure.

Densities of the conductive elements 146 in different regions may correspond to the densities of the electrical components 142 in the different regions. A density of the conductive elements 146 can be defined by an area ratio of a total area of the conductive elements 146 to a total area of the insulating layer 145 in one region (e.g., the first region 11, the second region 12 or the third region 13) from a top view perspective. In some embodiments, the total area of the conductive elements 146 is defined by an exposed surface area of the conductive elements 146. In some embodiments, the total area of the insulating layer 145 is defined by an exposed surface area of the insulating layer 145. In some embodiments, a first density of the conductive elements 146 in the first region 11 is greater than a second density of the conductive elements 146 in the second region 12. In some embodiments, the second density of the conductive elements 146 in the second region 12 is greater than a third density of the conductive elements 146 in the third region 13. Widths of the conductive elements 146 in different regions may correspond to the densities of the electrical components 142 in the different regions. In some embodiments, a first width W1 of each of the conductive elements 146 in the first region 11 is less than a second width W2 of each of the conductive elements 146 in the second region 12. In some embodiments, the second width W2 is less than a third width W3 of each of the conductive elements 146 in the third region 13. A distance between two adjacent electrical elements 146 in one region may correspond to a density of the electrical components 142 of the region. A lower density of the electrical components 142 in one region can correspond to a greater distance between two adjacent conductive elements 146 in such region. In some embodiments, a first distance D1 between two adjacent conductive elements 146 in the first region is less than a second distance D2 between two adjacent conductive elements 146 in the second region. In some embodiments, the second distance D2 is less than a third distance D3 between two adjacent conductive elements 146 in the third region. In some embodiments, the width W1, the width W2 or the width W3 is in a range of 0.0001 to 500 microns.

For ease of illustration and simplicity of drawings, portions of the substrate 14 below the insulating layer 145 and the conductive elements 146 are omitted in the following disclosure. However, it is not intended to limit the present disclosure.

Figure 5:
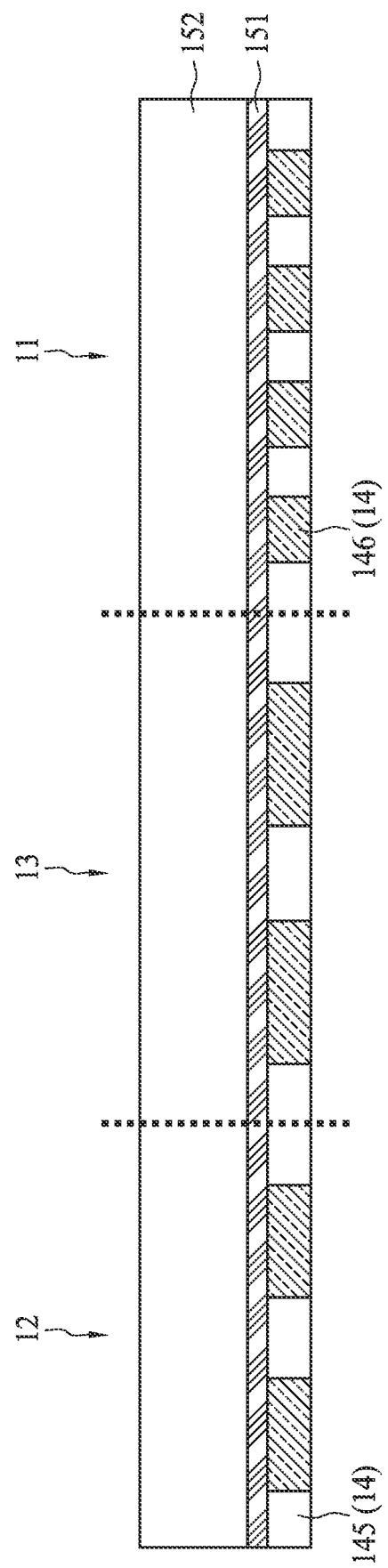

Please refer to FIG. 5, which is a schematic cross-sectional diagram along the line A-A' shown in FIG. 3 in accordance with the operation 601 of the method 600 and/or the operation 701 of the method 700 according to some embodiments of the present disclosure. A dielectric layer 152 is formed over the substrate 14. More specifically, the dielectric layer 152 may be formed on and may cover the conductive elements 146 and the insulating layer 145. In some embodiments, the dielectric layer 152 is formed by a deposition. In some embodiments, the dielectric layer 152 is formed by a blanket deposition. In some embodiments, the dielectric layer 152 covers an entirety of the conductive elements 146 in the first region 11, the second region 12 and the third region 13. In some embodiments, an etch stop layer 151 is formed prior to the formation of the dielectric layer 152 across the substrate 14. The etch stop layer 151 may be formed over the substrate 14 by a deposition. In some embodiments, the etch stop layer 151 covers at least the conductive elements 146 in the first region 11, the second region 12 and the third region 13. In some embodiments, the etch stop layer 151 is formed by a blanket deposition.

Figure 6:
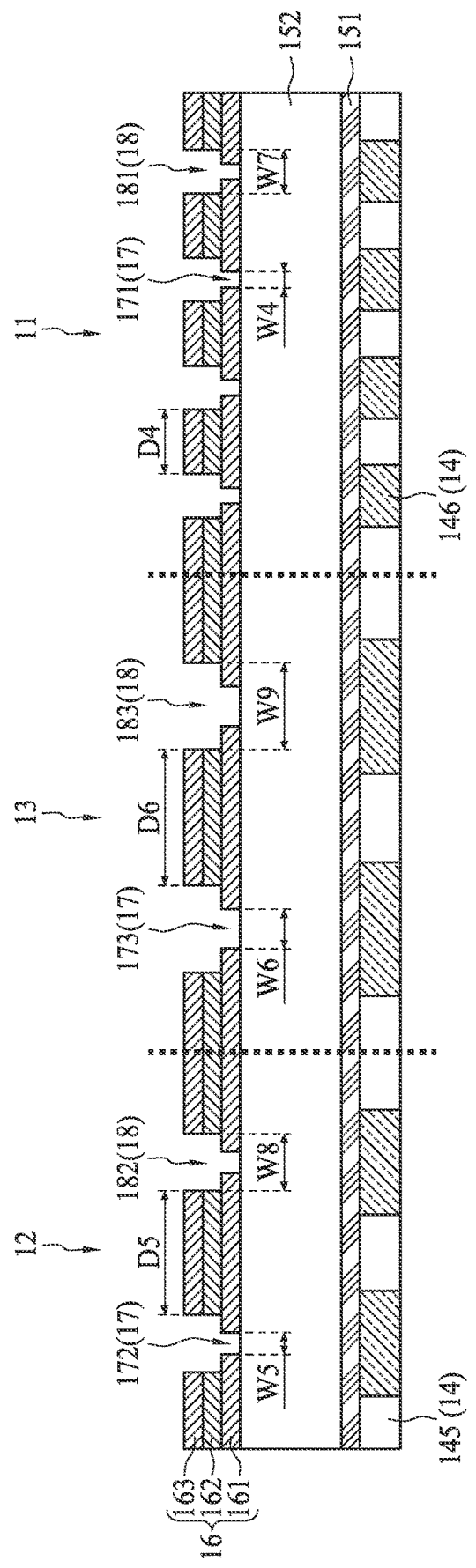

Please refer to FIG. 6, which is a schematic cross-sectional diagram along the line A-A' shown in FIG. 3 at a different stage of the method 600 and/or the method 700 according to some embodiments of the present disclosure. Prior to the operation 602 of the method 600 and/or the operation 702 of the method 700, the method 600 and/or the method 700 may further include operations of forming and patterning a mask layer 16. In some embodiments, the mask layer 16 is a multi-layered structure as shown in FIG. 6. In some embodiments, the mask layer 16 includes a first sublayer 161, a second sublayer 162 and a third sublayer 163. The first sublayer 161, the second sublayer 162 and the third sublayer 163 may have different patterns. In some embodiments as shown in FIG. 6, a plurality of openings 17 defined by the first sublayer 161 are overlapped by a plurality of openings 18 defined by the second sublayer 162 and the third sublayer 163. In some embodiments, each of the openings 17 connects to and extends from each of the openings 18. In some embodiments, the opening 17 is smaller than its corresponding opening 18. In some embodiments, the opening 17 is entirely overlapped by the corresponding opening 18 to form a T-shaped trench. A plurality of the T-shaped trenches may be used to define openings and through vias formed in the dielectric layer 152 in subsequent operations of the method 600 and/or the method 700.

Widths of the openings 17 in different regions can be different. In some embodiments, the openings 17 include openings 171 in the first region 11, openings 172 in the second region 12, and openings 173 in the third region 13. In some embodiments, a width W4 of an opening 171 in the first region 11 is less than a width W5 of an opening 172 in the second region 12. In some embodiments, the width W5 of the opening 172 is less than a width W6 of an opening 173 in the third region 13. Widths of the openings 18 in different regions can be also different. In some embodiments, the openings 18 include openings 181 in the first region 11, openings 182 in the second region 12, and openings 183 in the third region 13. In some embodiments, a width W7 of an opening 181 in the first region 11 is less than a width W8 of an opening 182 in the second region 12. In some embodiments, the width W8 of the opening 182 is less than a width W9 of an opening 183 in the third region 13.

Distances between the openings 18 within a region can vary between regions. In some embodiments, a distance D4 between adjacent openings 181 in the first region 11 is less than a distance D5 between adjacent openings 182 in the second region 12. In some embodiments, the distance D5 is less than a distance D6 between adjacent openings 183 in the third region 13. Distances between the openings 17 within a region can also vary between regions, and can correspond to the distances between the openings 18 in different regions as described above. Densities of the openings 18 (or the openings 17) in different regions correspond to densities of the conductive elements 146 and/or densities of the electrical elements 142 as illustrated above. Repeated description is omitted herein.

Figure 7:
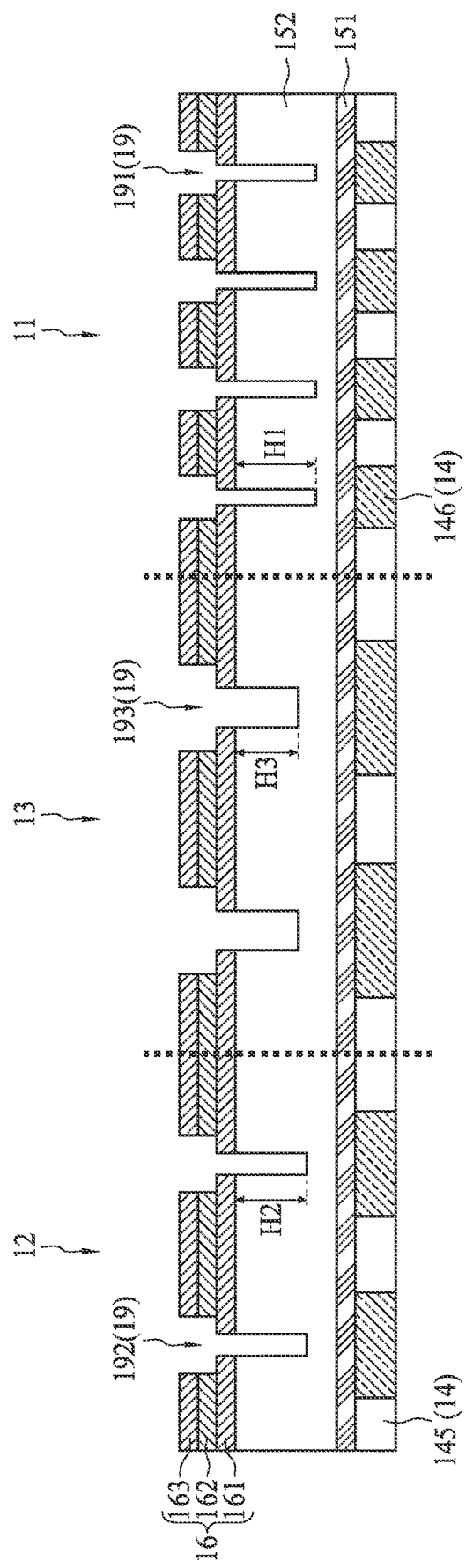

Please refer to FIG. 7, which is a schematic cross-sectional diagram along the line A-A' shown in FIG. 3 at a different stage of the method 600 and/or the method 700 according to some embodiments of the present disclosure. In the operation 602 of the method 600 and/or the operation 702 of the method 700, a first etching is performed, and portions of the dielectric layer 152 are removed using the mask layer 16 as a mask. In some embodiments, the first etching targets the dielectric layer 152, thereby forming a plurality of openings 19 in different regions (e.g., the first region 11, the second region 12 and the third region 13) in the dielectric layer 152. The plurality of openings 19 can include a plurality of first openings 191 in the first region 11, a plurality of second openings 192 in the second region 12, and a plurality of third openings 193 in the third region 13. In some embodiments, the plurality of first openings 191 may be defined by the openings 171 of the mask layer 16. In some embodiments, the plurality of second openings 192 may be defined by the openings 172 of the mask layer 16. In some embodiments, the plurality of third openings 193 may be defined by the openings 173 of the mask layer 16. In some embodiments, the first openings 191, the second openings 192 and the third openings 193 are respectively referred to as first trenches 191, second trenches 192 and third trenches 193.

At least one of the first openings 191, the second openings 192 and the third openings 193 may stop at the dielectric layer 152 and may be separated from the conductive elements 146. Etching rates of the first etching in different regions may be different. In some embodiments, the etching rate of the first etching in each region corresponds to the densities of the openings 17 or the openings 18 in such region. In some embodiments, the etching rate of the first etching in each region corresponds to the widths of the openings 17 or the openings 18 in such region. In some embodiments, the etching rate of the first etching in each region corresponds to the distances between the openings 18 in such regions. In some embodiments, an etching rate in the first region is greater than an etching rate in the second region. In some embodiments, the etching rate in the second region is greater than an etching rate in the third region. In other words, in such embodiments, a depth H1 of the first openings 191 measured from a top of the dielectric layer 152 to a bottom of the first openings 191 is greater than a depth H2 of the second openings 192 measured from the top of the dielectric layer 152 to a bottom of the second openings 192. In some embodiments, the depth H2 is greater than a depth H3 of the third openings 193 measured from the top of the dielectric layer 152 to a bottom of the third openings 193.

Figure 8:
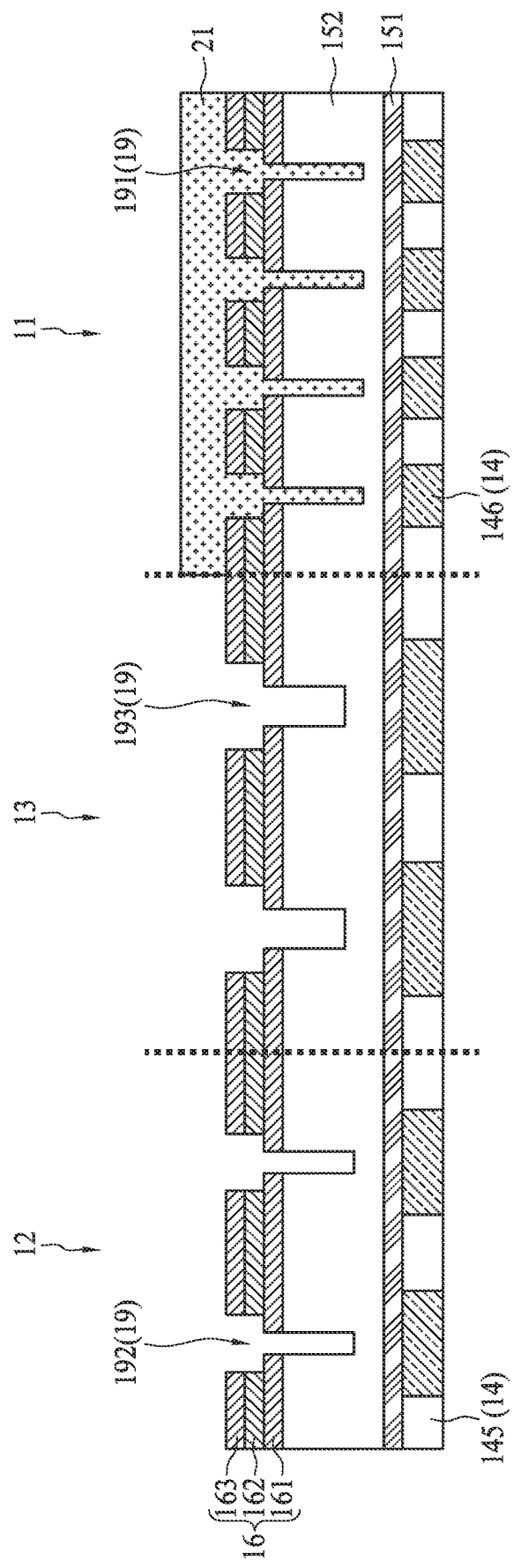

Please refer to FIG. 8, which is a schematic cross-sectional diagram along the line A-A' shown in FIG. 3 at a different stage of the method 600 and/or the method 700 according to some embodiments of the present disclosure. Prior to the operation 603 of the method 600 and/or in the operation 703 of the method 700, a photoresist layer 21 is formed in the first region 11 over the substrate 14. In some embodiments, the photoresist layer 21 is referred to as a first mask layer 21. In some embodiments, the first mask layer 21 can include a positive photoresist material, a negative photoresist material, oxide, nitride, oxynitride, another suitable hard mask material, or a combination thereof. In some embodiments, a material of the first mask layer 21 is different from those of the mask layer 16 and that of the dielectric layer 152. For ease of description, the term "photoresist layer" is used to describe the layer 21 shown in the figures. The photoresist layer 21 may cover all of the first openings 191 in the first region 11 and leave exposed the second openings 192 in the second region and the third openings 193 in the third region 13. The photoresist layer 21 may or may not fill all portions of the first openings 191. In some embodiments, the photoresist layer 21 fills the first opening 191. In some embodiments, one or more of the first openings 191 are partially filled by the photoresist layer 21. In some embodiments, the first openings 191 are completely filled by the photoresist layer 21. In some embodiments, the photoresist layer 21 covers or seals tops of the first openings 191.

Figure 9:
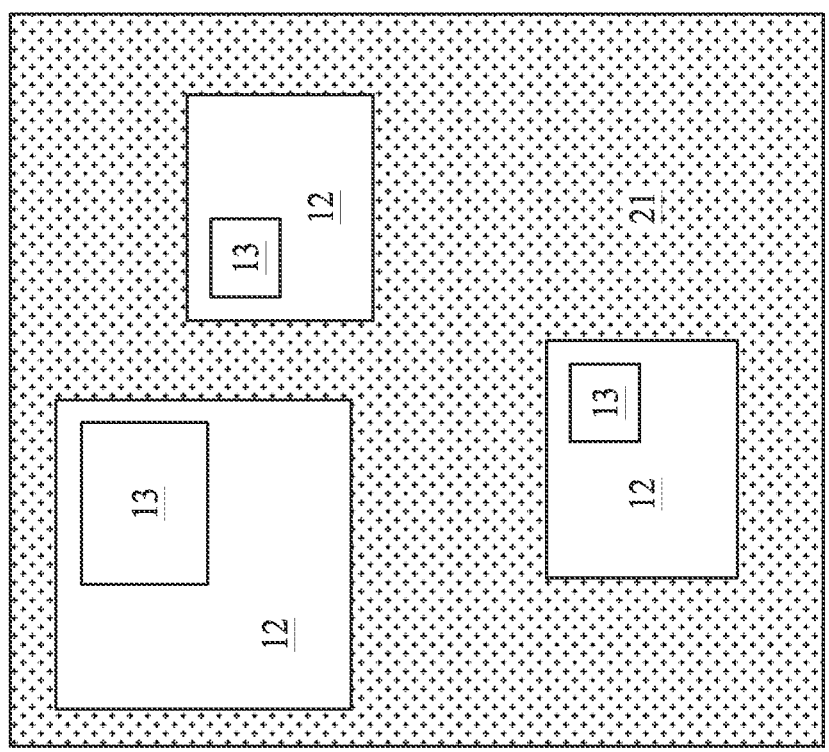
FIG. 9 is a schematic top view of a mask layer in accordance with some embodiments of the disclosure.

FIG. 9 is a schematic top view of the photoresist layer 21 at the stage shown in FIG. 8 of the method 600 and/or the method 700 according to some embodiments of the present disclosure. As shown in FIG. 9 and FIG. 3, the photoresist layer 21 may be formed in only the first region 11 of the semiconductor structure 10. In some embodiments, a configuration of the photoresist layer 21 is substantially same as a configuration of the first region 11 from a top view perspective. In some embodiments, the photoresist layer 21 leaves a portion of the first region 11 exposed and covers all the first openings 191. In some embodiments, the photoresist layer 21 covers a portion of the substrate 14 outside the first region 11 but leaves exposed an entirety of the second openings 192 and an entirety of the third openings 193.

Figure 10:
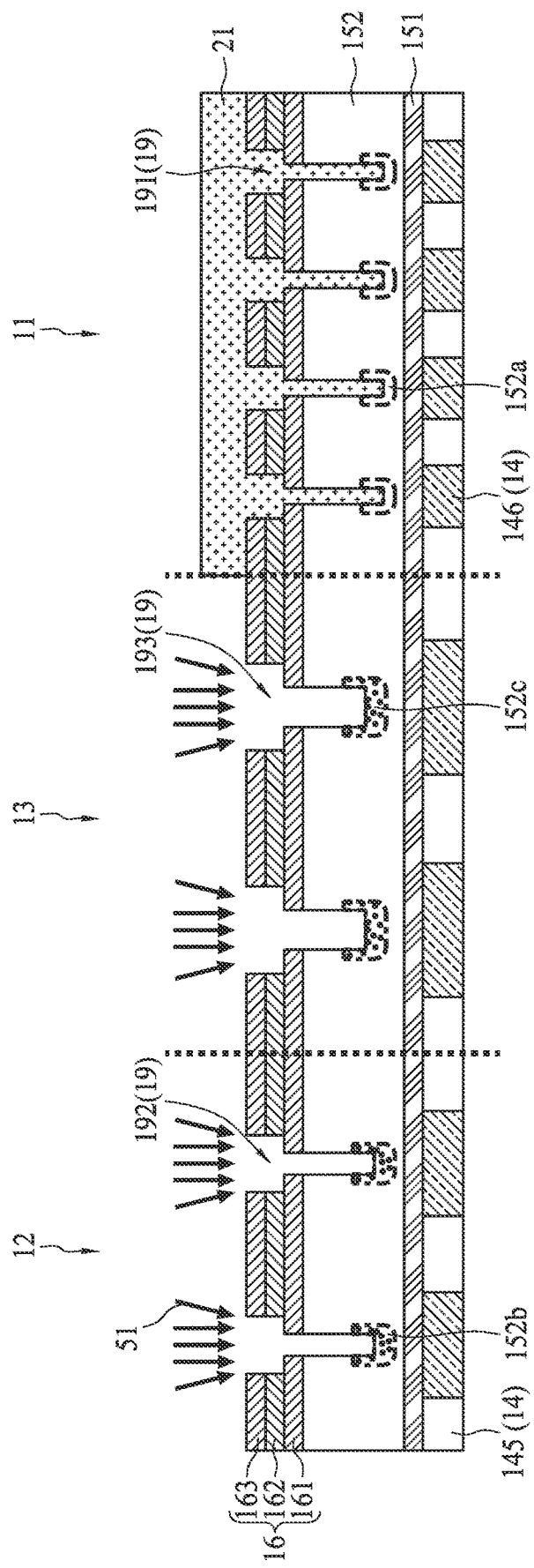
FIGS. 10 to 11 are schematic diagrams at different stages of a method for manufacturing a semiconductor structure in accordance with different embodiments of the disclosure.

Please refer to FIG. 10, which is a schematic cross-sectional diagram along the line A-A' shown in FIG. 3 at a different stage of the method 600 and/or the method 700 according to some embodiments of the present disclosure. In the operation 603 of the method 600 and/or the operation 704 of the method 700, an amorphization 51 is performed on the dielectric layer 152. In some embodiments, the amorphization 51 includes an introduction of a first dopant to the dielectric layer 152. In some embodiments, the amorphization 51 is realized using a first implantation. In some embodiments, the amorphization 51 is performed in the second region 12 and the third region 13. In some embodiments, the amorphization 51 targets bottoms of the second openings 192 and the third openings 193. In some embodiments, the first dopant is introduced to the bottom of each of the second openings 192 and the bottom of each of the third openings 193. In some embodiments, the second dopant includes carbon (C), silicon (Si), germanium (Ge), tin (Sn), lead (Pb), boron (B), aluminum (Al), gallium (Ga), indium (In), thallium (Tl), nitride (N), phosphorus (P), arsenic (As), antimony (Sb), bismuth (Bi), or a combination thereof. A first region 152a of the dielectric layer 152 surrounding bottom portions of each of the first openings 191 is denser than a second region 152b of the dielectric layer 152 surrounding bottom portions of each of the second openings 192. A third region 152c of the dielectric layer 152 surrounding each of bottom portions of the third openings 193 is less dense than the first region 152a of the dielectric layer 152. A structural density of the third region 152c is substantially equal to a structural density of the second region 152b. In some embodiments, a doping concentration of the second region 152b is substantially equal to a doping concentration of the third region 152c. In some embodiments, a boundary may be formed or observed between the second region 152b and a remaining portion of the dielectric layer 152. In some embodiments, a boundary nay be formed or observed between the third region 152c and the remaining portion of the dielectric layer 152. In some embodiments, the first region 152a of the dielectric layer 152 is dopant-free.

Figure 11:
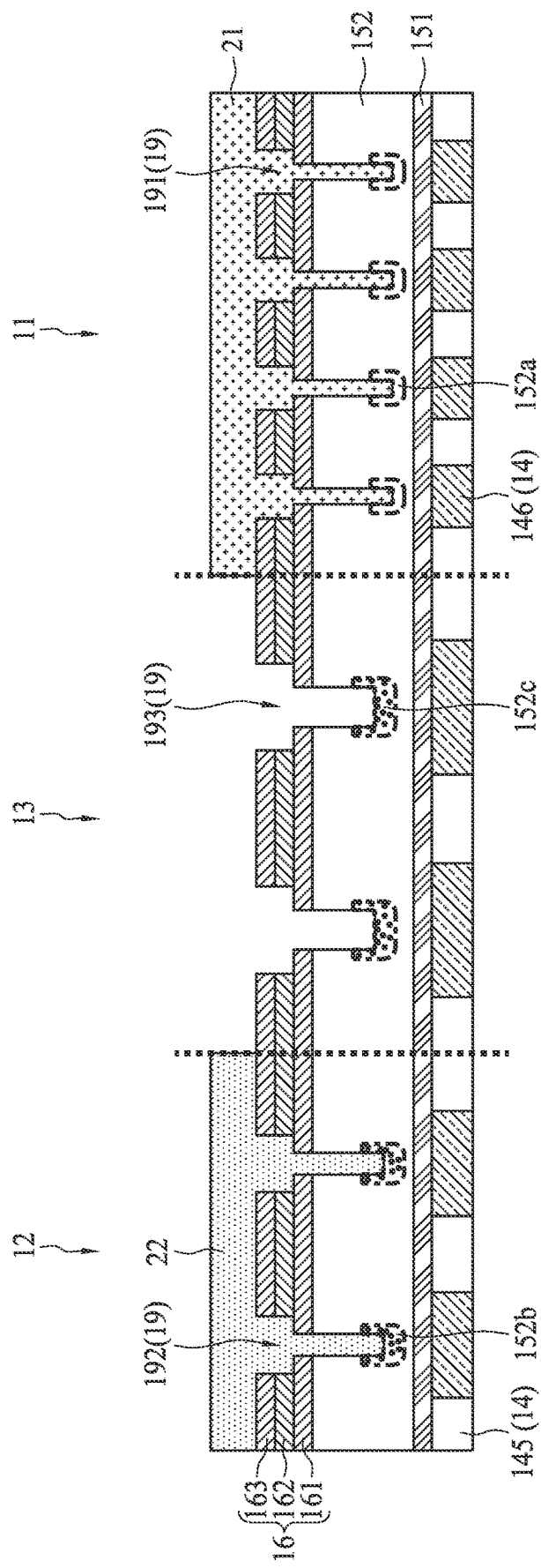

Please refer to FIG. 11, which is a schematic cross-sectional diagram along the line A-A' shown in FIG. 3 at a different stage of the method 600 and/or the method 700 according to some embodiments of the present disclosure. Prior to the operation 604 of the method 600 and/or in the operation 705 of the method 700, a photoresist layer 22 is formed in the second region 12 over the substrate 14. In some embodiments, the photoresist layer 22 is referred to as a second mask layer 22. A material of the second mask layer 22 can be similar to or same as that of the first mask layer 21 as illustrated above. For ease of description, the term "photoresist layer" is used to describe the layer 22 shown in the figures. The photoresist layer 22 may cover all of the second openings 192 in the second region 12 and leave exposed the third openings 193 in the third region 13. The photoresist layer 22 may or may not fill all portions of the second openings 192. In some embodiments, the photoresist layer 22 fills the second opening 192. In some embodiments, one or more of the second openings 192 are partially filled by the photoresist layer 22. In some embodiments, the second openings 192 are completely filled by the photoresist layer 22. In some embodiments, the photoresist layer 22 covers or seals tops of the first openings 191.

Figure 12:
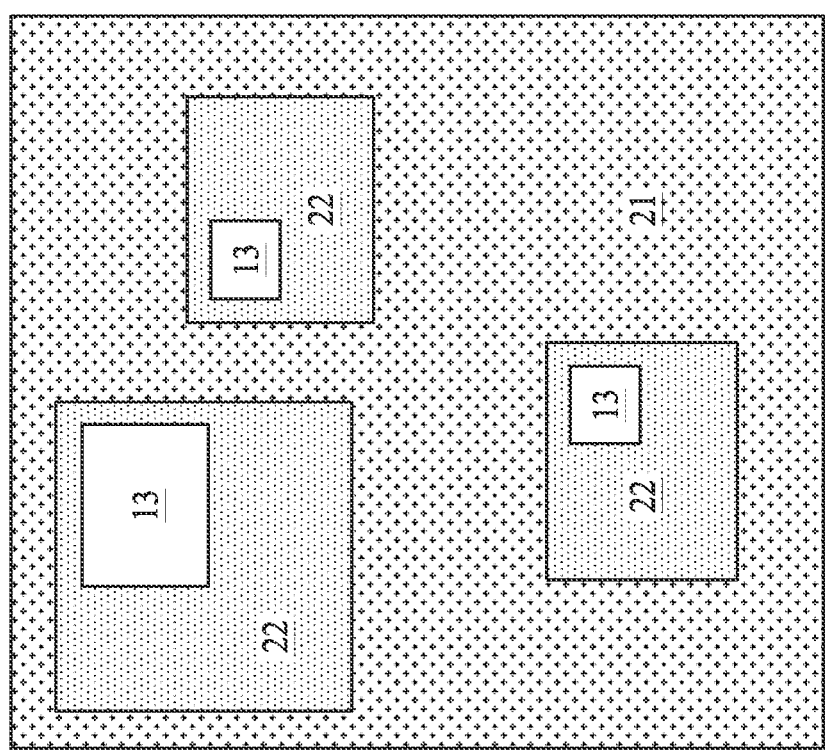
FIG. 12 is a schematic top view of a mask layer in accordance with some embodiments of the disclosure.

FIG. 12 is a schematic top view of the photoresist layer 22 at the stage shown in FIG. 11 of the method 600 and/or the method 700 according to some embodiments of the present disclosure. Referring to FIG. 12 and FIG. 3, the photoresist layer 22 may be formed in only the second region 12 of the semiconductor structure 10. In some embodiments, a configuration of the photoresist layer 22 is substantially same as a configuration of the second region 12 from a top view perspective. In some embodiments, the photoresist layer 22 leaves a portion of the second region 12 exposed and covers all the second openings 192. In some embodiments, the photoresist layer 22 covers a portion of the substrate 14 outside the second region 12 but leaves an entirety of the third openings 193 exposed.

Figure 13:
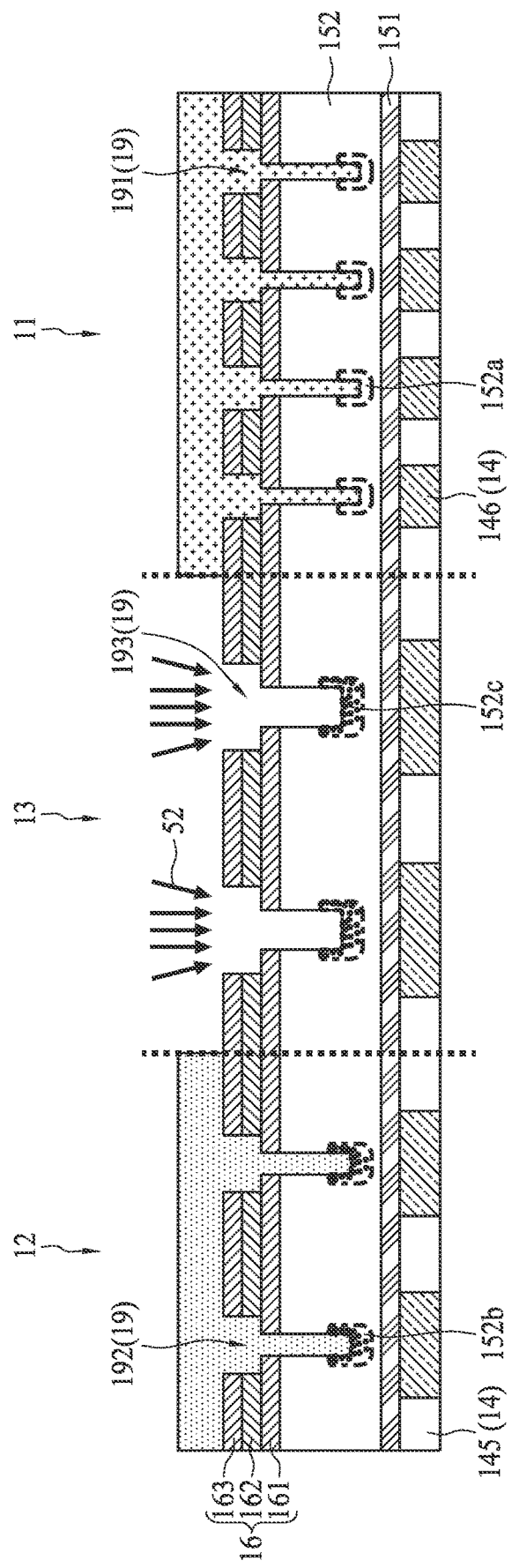
FIGS. 13 to 18 are schematic diagrams at different stages of a method for manufacturing a semiconductor structure in accordance with different embodiments of the disclosure.

Please refer to FIG. 13, which is a schematic cross-sectional diagram along the line A-A' shown in FIG. 3 at a different stage of the method 600 and/or the method 700 according to some embodiments of the present disclosure. Prior to the operation 604 of the method 600 and/or in the operation 706 of the method 700, an amorphization 52 is performed on the dielectric layer 152. In some embodiments, the amorphization 52 includes an introduction of a second dopant to the dielectric layer 152. In some embodiments, the amorphization 52 is realized by using a second implantation. In some embodiments, the amorphization 52 is performed in the third region 13. In some embodiments, the amorphization 52 targets bottoms of the third openings 193. In some embodiments, the second dopant is introduced to the third region 152c of the dielectric layer 152. The second dopant can be same as or different from the first dopant. In some embodiments, the second dopant includes carbon (C), silicon (Si), germanium (Ge), tin (Sn), lead (Pb), boron (B), aluminum (Al), gallium (Ga), indium (In), thallium (Tl), nitride (N), phosphorus (P), arsenic (As), antimony (Sb), bismuth (Bi), or a combination thereof. In some embodiments, a structural density of the third region 152c of the dielectric layer 152 is less than the structural densities of the second region 152b or the first region 152a of the dielectric layer 152. In some embodiments, a doping concentration of the third region 152c of the dielectric layer 152 is substantially greater than the doping concentration of the second region 152b of the dielectric layer 152. In some embodiments, the first region 152a remains dopant-free. In some embodiments, the second dopant stops in the third region 152c due to the boundary formed in the operation 603 of the method 600 and/or the operation 704 of the method 700 as shown in FIG. 10.

Figure 14:
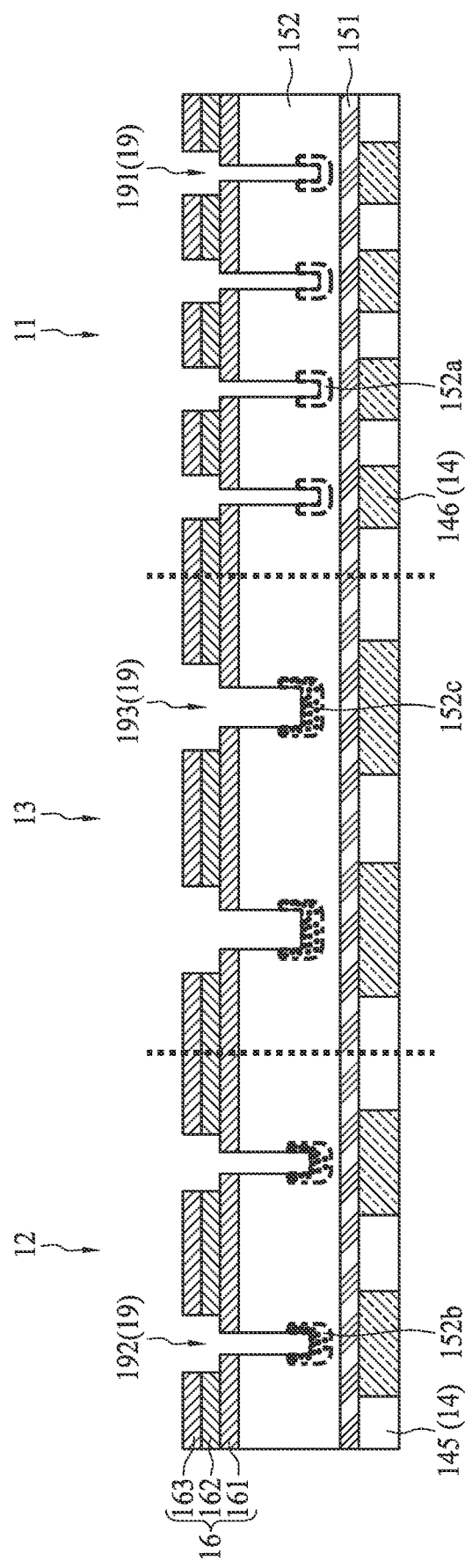

Please refer to FIG. 14, which is a schematic cross-sectional diagram along the line A-A' shown in FIG. 3 at a different stage of the method 600 and/or the method 700 according to some embodiments of the present disclosure. Prior to the operation 604 of the method 600 and/or in the operation 707 of the method 700, the photoresist layer 21 and the photoresist layer 22 are removed. The first openings 191, the second openings 192 and the third openings 193 are thereby exposed.

Figure 15:
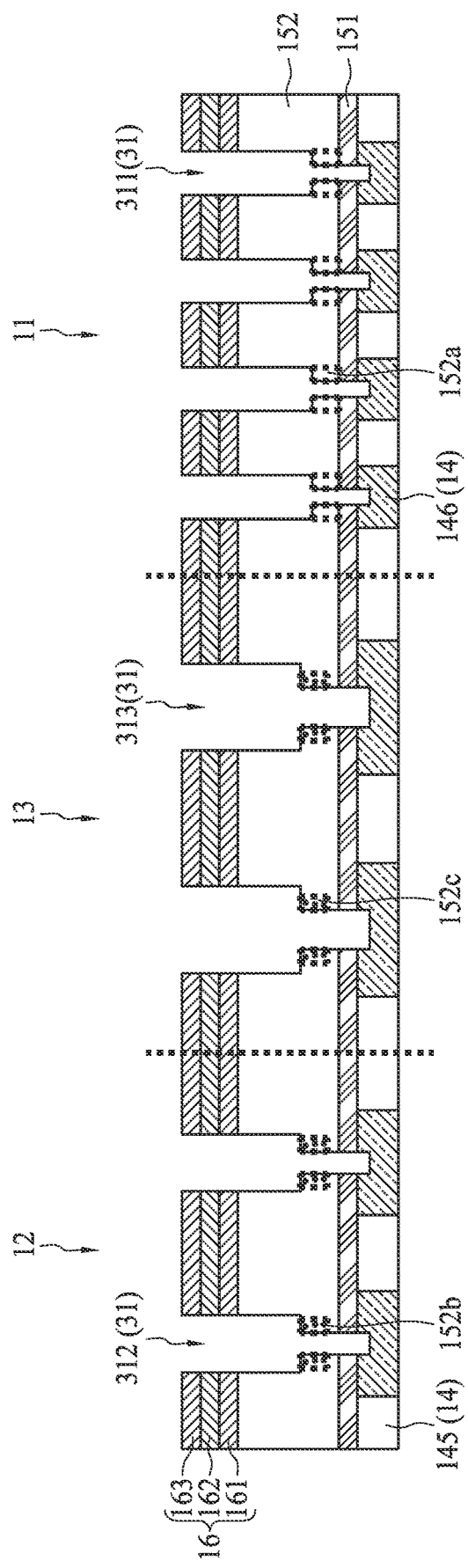

Please refer to FIG. 15, which is a schematic cross-sectional diagram along the line A-A' shown in FIG. 3 at a different stage of the method 600 and/or the method 700 according to some embodiments of the present disclosure. In the operation 604 of the method 600 and/or the operation 708 of the method 700, a second etching is performed on the dielectric layer 152. In some embodiments, the third sublayer 163 is used as a mask to remove portions of the dielectric layer 152. Due to the structural densities of the second region 152b and the third region 152c are less than a structural density of a portion of the dielectric layer 152 outside the regions 152b and 152c, an etching rate of the second etching 52 in a region 11, 12 or 13 is greater than an etching rate of the first etching 51 in the same region 11, 12 or 13. In addition, a lower structural density can result in a higher etching rate of a same etching operation. In some embodiments, an etching rate of the second etching 52 in the second region 12 is greater than an etching rate of the first etching 51 in the second region 12. In some embodiments, an etching rate of the second etching 52 in the third region 13 is greater than an etching rate of the first etching 51 in the third region 13. In some embodiments, an etching rate of the second etching 52 in the third region 13 is greater than an etching rate of the second etching 52 in the second region 12. In some embodiments, the etching rate of the second etching 52 in the second region 12 is greater than an etching rate of the second etching 52 in the first region 11. In some embodiments, portions of the first sublayer 161 exposed through the third sublayer 163 are also removed by the second etching. A plurality of through vias 31 are formed in the first region 11, the second region 12 and the third region 13 through the plurality of openings 19 shown in FIG. 14. In some embodiments, a profile of the through via 31 is similar to a combined profile of a corresponding opening 19, a corresponding opening 17 and a corresponding opening 18. In some embodiments, the profile of the through via 31 is defined by the combined profile of the corresponding opening 19, the corresponding opening 17 and the corresponding opening 18. In some embodiments, each of the through vias 31 has a T-shaped profile.

Each of the through vias 31 penetrates the dielectric layer 152. In some embodiments, each of the through vias 31 penetrates the etch stop layer 151. In some embodiments, the conductive elements 146 are exposed through the dielectric layer 152 through the through vias 31. In some embodiments, a portion of the conductive element 146 at a bottom of each of the through vias 31 is removed. The through vias 31 can include a plurality of first through vias 311 in the first region 11, a plurality of second through vias 312 in the second region 12, and a plurality of third through vias 313 in the third region 13. In some embodiments, each of the first through vias 311 penetrates a corresponding first region 152a of the dielectric layer 152. In some embodiments, each of the second through vias 312 penetrates a corresponding second region 152b of the dielectric layer 152. In some embodiments, each of the third through vias 313 penetrates a corresponding third region 152c of the dielectric layer 152. The first region 152a may surround or encircle a lower portion of each of the first through vias 311. The second region 152b may surround or encircle a lower portion of each of the second through vias 312. The third region 152c may surround or encircle a lower portion of each of the third through vias 313. In some embodiments, the lower portion of the through via 311, 312 or 313 is defined as a vertical portion below a horizontal portion of the T-shaped configuration.

Figure 16:
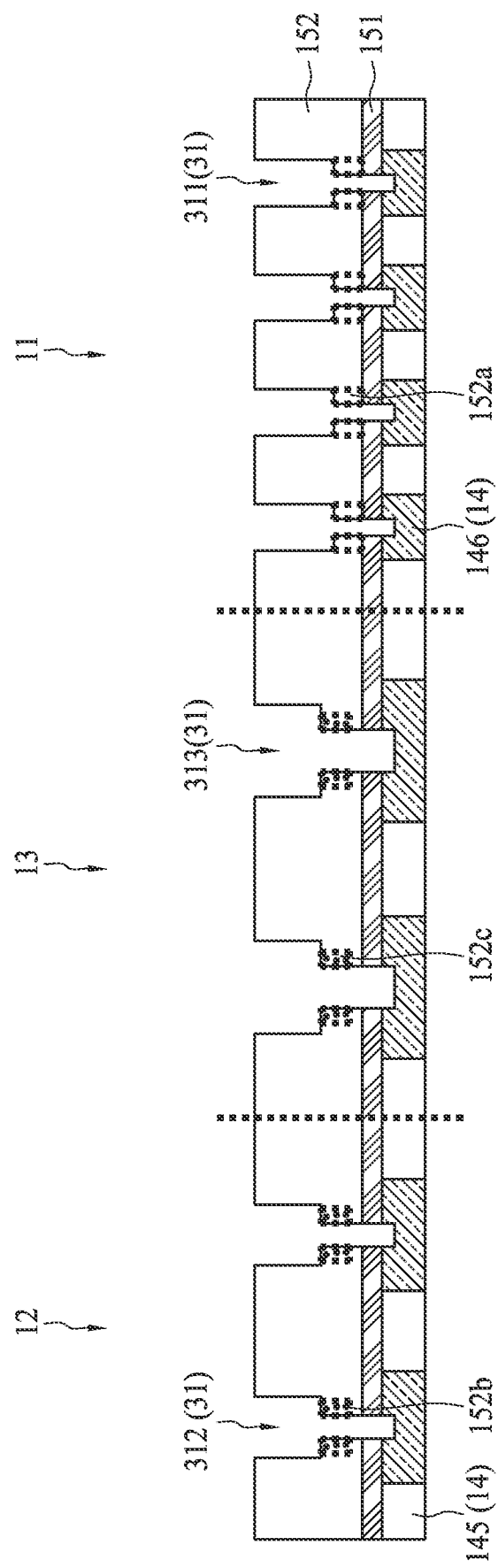

Please refer to FIG. 16, which is a schematic cross-sectional diagram along the line A-A' shown in FIG. 3 at a different stage of the method 600 and/or the method 700 according to some embodiments of the present disclosure. After the operation 604 of the method 600 and/or the operation 708 of the method 700, the mask layer 16 is removed. A top surface of the dielectric layer 152 is thereby exposed.

Figure 17:
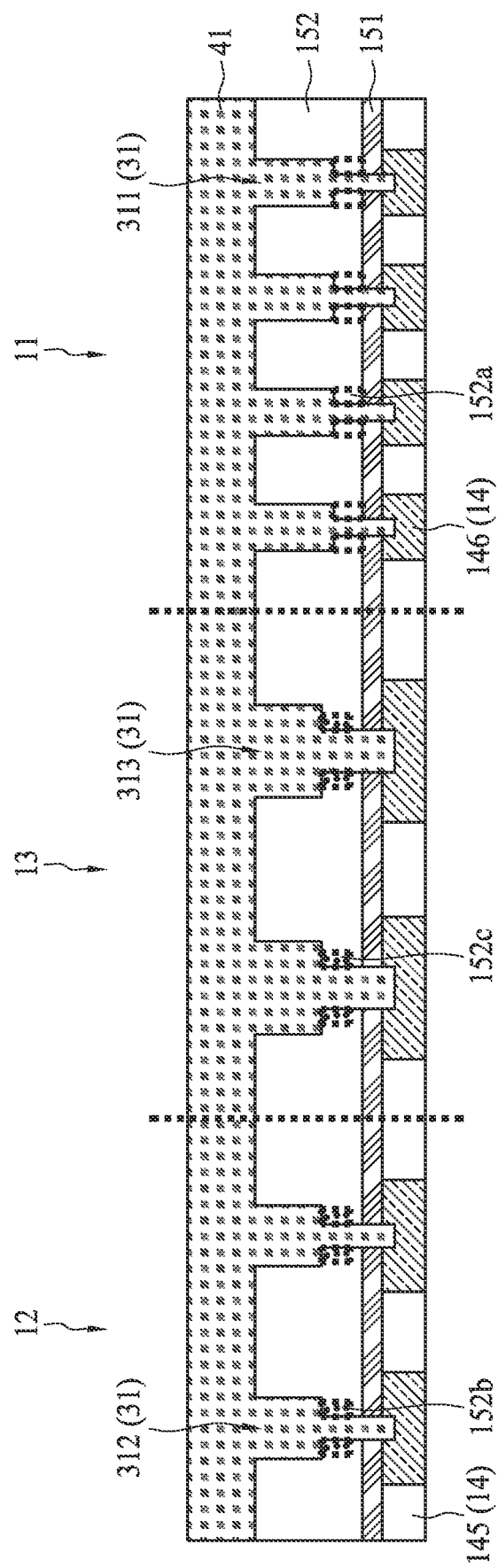

Please refer to FIG. 17, which is a schematic cross-sectional diagram along the line A-A' shown in FIG. 3 at a different stage of the method 600 and/or the method 700 according to some embodiments of the present disclosure. After the operation 604 of the method 600 and/or the operation 708 of the method 700, a conductive material 41 is formed over the dielectric layer 152. In some embodiments, the conductive material 41 may be formed on the dielectric layer 152 and fills the through vias 31. In some embodiments, the conductive material 41 is electrically connected to the conductive elements 146. In some embodiments, the conductive material 41 is in contact with the conductive elements 146. In some embodiments, the conductive material 41 is in physical contact with the conductive elements 146. A material of the conductive material 41 can be same as or different from that of the conductive elements 146. In some embodiments, the conductive material 41 includes copper (Cu), aluminum (Al), tungsten (W), manganese (Mn), cobalt (Co), titanium (Ti), or a combination thereof.

Figure 18:
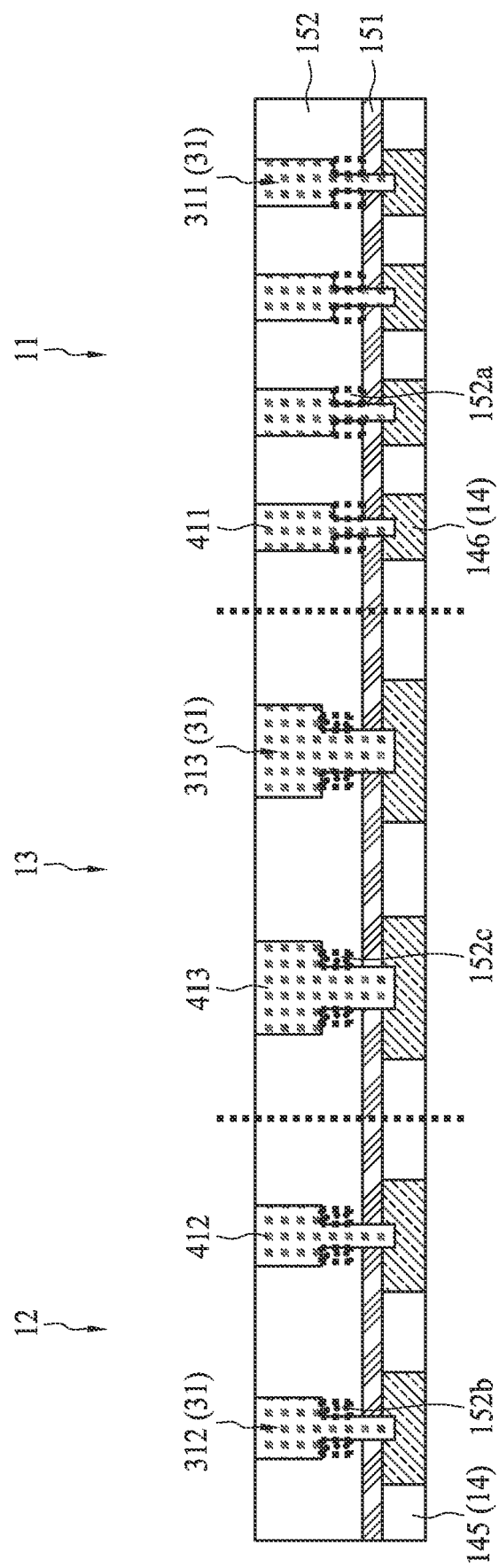

Please refer to FIG. 18, which is a schematic cross-sectional diagram along the line A-A' shown in FIG. 3 at a different stage of the method 600 and/or the method 700 according to some embodiments of the present disclosure. After the operation 604 of the method 600 and/or the operation 708 of the method 700, a portion of the conductive material 41 disposed on top of the dielectric layer 152 is removed, and a plurality of via structures are formed in the dielectric layer 152. In some embodiments, a plurality of via structures 411 are formed in the first region 11, wherein each of the via structures 411 is surrounded by a dopant-free region (i.e., the first region 152a). In some embodiments, a plurality of via structures 412 are formed in the second region 12, wherein each of the via structures 412 is surrounded by a first doping region (i.e., the second region 152b). In some embodiments, a plurality of via structures 413 are formed in the third region 13, wherein each of the via structures 413 is surrounded by a second doping region (i.e., the third region 152c). In some embodiments, a doping concentration of the first doping region 152b of the dielectric layer 152 is substantially greater than a doping concentration of the second doping region 152c of the dielectric layer 152. In some embodiments, the second dopant is same as the first dopant, and the second doping region 152c includes a same ingredient as the first doping region 152b. In some embodiments, the second dopant is different from the first dopant, the second doping region 152c includes an ingredient different from that of the first doping region 152b, and a concentration of the first dopant in the first doping region 152b is substantially equal to a concentration of the second dopant in the second doping region 152c.

As a property of an etching operation, different etching rates may be found in different regions in which via structures of different densities are to be formed. The present disclosure therefore provides a method to control structural densities in different regions according to different densities of the via structures to be formed. A region determined to have a slower etching rate is provided with amorphization one or more times. Therefore, the etching rate in the region can be adjusted so as to allow the etching rates in different regions across a wafer to be substantially equal. A result of the etching operation can be thereby improved, and a product yield can be also improved.

The above description is for a purpose of illustration of the concept of the present disclosure, and the present disclosure is not limited to the embodiments as described above and illustrated in FIGS. 4 to 18. In order to achieve the purpose of the present disclosure as described above, in an alternative embodiment, the operation 603 of the method 600 depicted in FIG. 10 can be performed after the operation depicted in FIG. 13. Similarly, in an alternative embodiment, the operation 704 of the method 700 depicted in FIG. 10 can be performed after the operation 706 depicted in FIG. 13.

Figure 19:
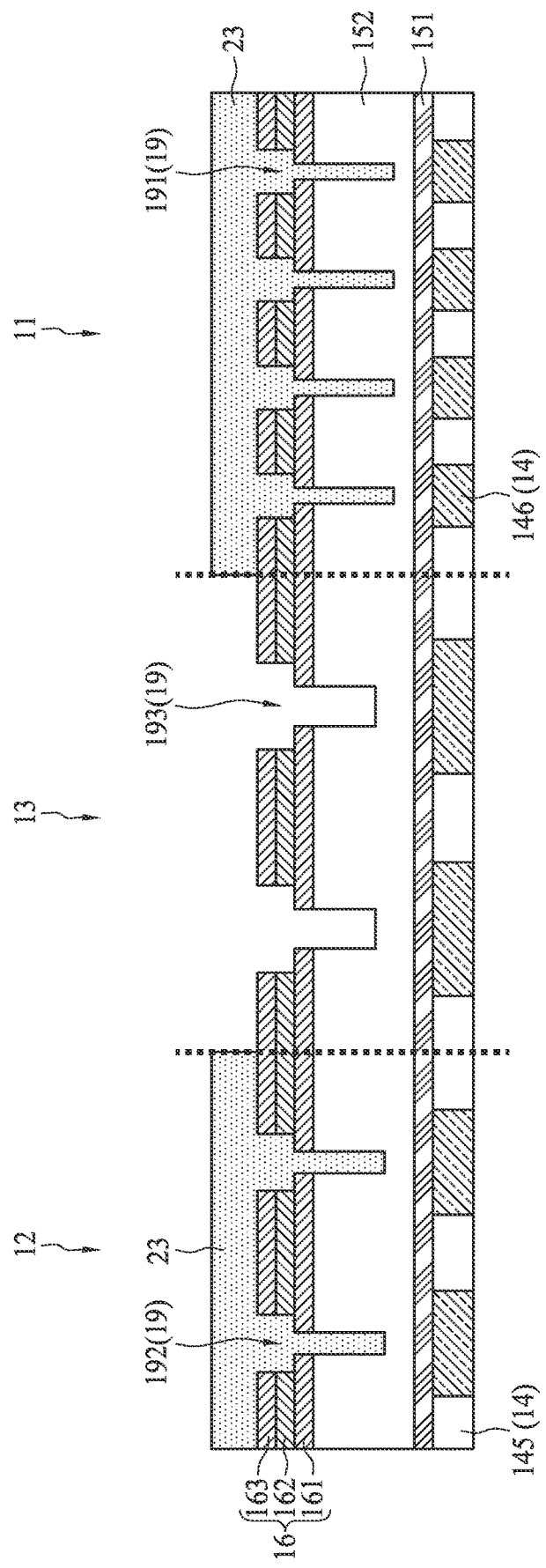
FIG. 19 is a schematic diagram at a stage of a method for manufacturing a semiconductor structure in accordance with different embodiments of the disclosure.
Figure 20:
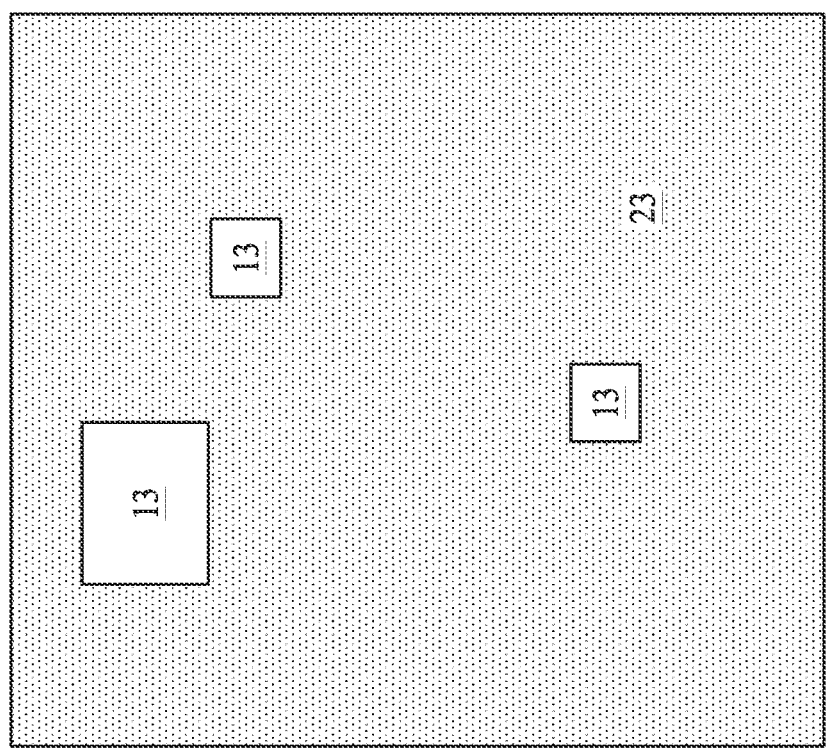
FIG. 20 is a schematic top view of a mask layer in accordance with some embodiments of the disclosure.

FIG. 19 is a schematic cross-sectional diagram along the line A-A' shown in FIG. 3 at a different stage of the method 600 and/or the method 700 according to some embodiments of the present disclosure. FIG. 20 is a schematic top view of a photoresist layer 23 according to some embodiments of the present disclosure. Referring to FIGS. 3 and 19 to 20, in alternative embodiments, after the operation 602 of the method 600 and/or the operation 702 of the method 700, the photoresist layer 23 is formed over the dielectric layer 152. In some embodiments, the photoresist layer 23 covers the first region 11 and the second region 12. In some embodiments, the photoresist layer 23 fills the first openings 191 in the first region 11 and the second openings 192 in the second region 12. In some embodiments, only the third region 13 is exposed through the photoresist layer 23.

Figure 21:
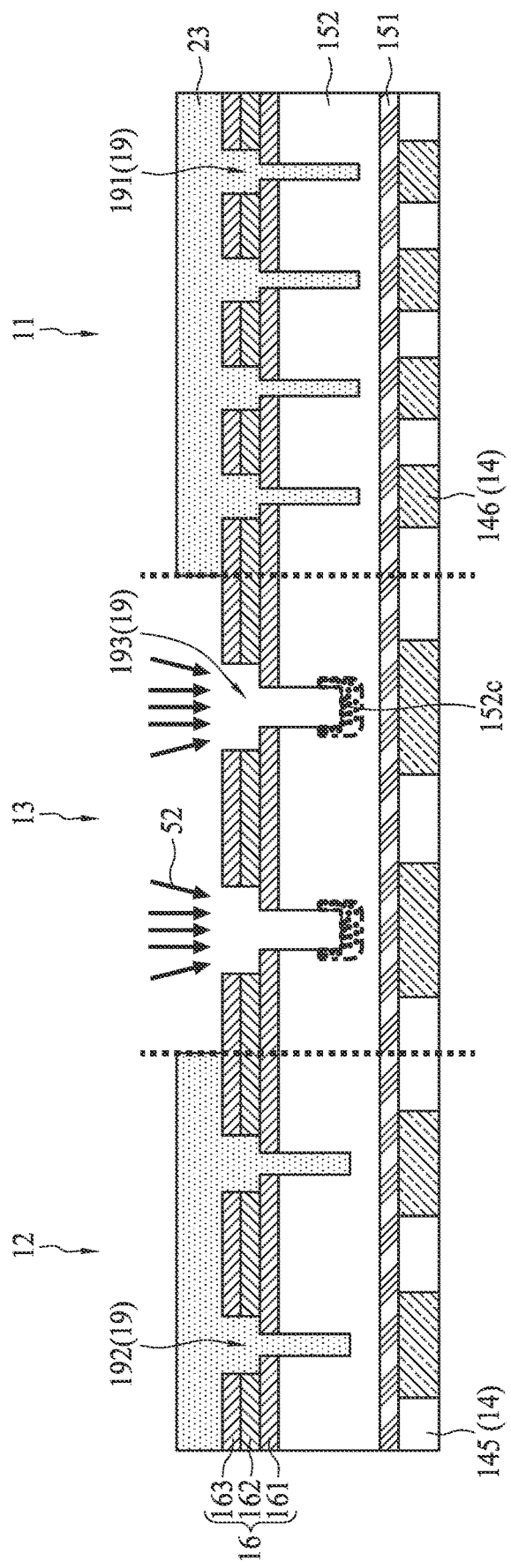
FIGS. 21 to 24 are schematic diagrams at different stages of a method for manufacturing a semiconductor structure in accordance with different embodiments of the disclosure.

FIG. 21 is a schematic cross-sectional diagram along the line A-A' shown in FIG. 3 at a different stage of the method 600 and/or the method 700 according to some embodiments of the present disclosure. The operation of the method 600 as depicted in FIG. 13 and/or the operation 706 is performed after formation of the photoresist layer 23. The amorphization 52 is performed, and the second dopant is introduced to a bottom portion of each of the third openings 193 of the dielectric layer 152 in the third region 13. The amorphization 52 is as described above in reference to FIG. 13, and repeated description is omitted herein.

Figure 22:
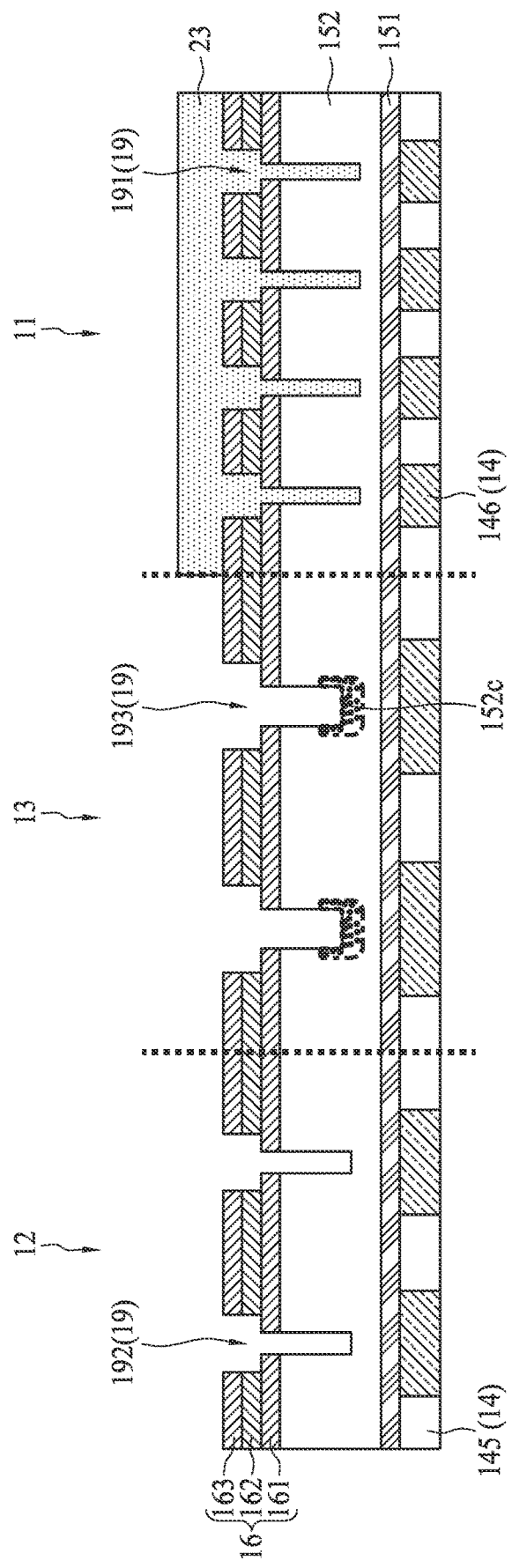

FIG. 22 is a schematic cross-sectional diagram along the line A-A' shown in FIG. 3 at a different stage of the method 600 and/or the method 700 according to some embodiments of the present disclosure. After the amorphization 52, a portion of the photoresist layer 23 over the second region 12 is removed. An entirety of the second openings 192 in the second region 12 is exposed. In some embodiments, a top view of the photoresist layer 23 at this stage is similar to the top view of the photoresist layer 21 as shown in FIG. 9.

Figure 23:
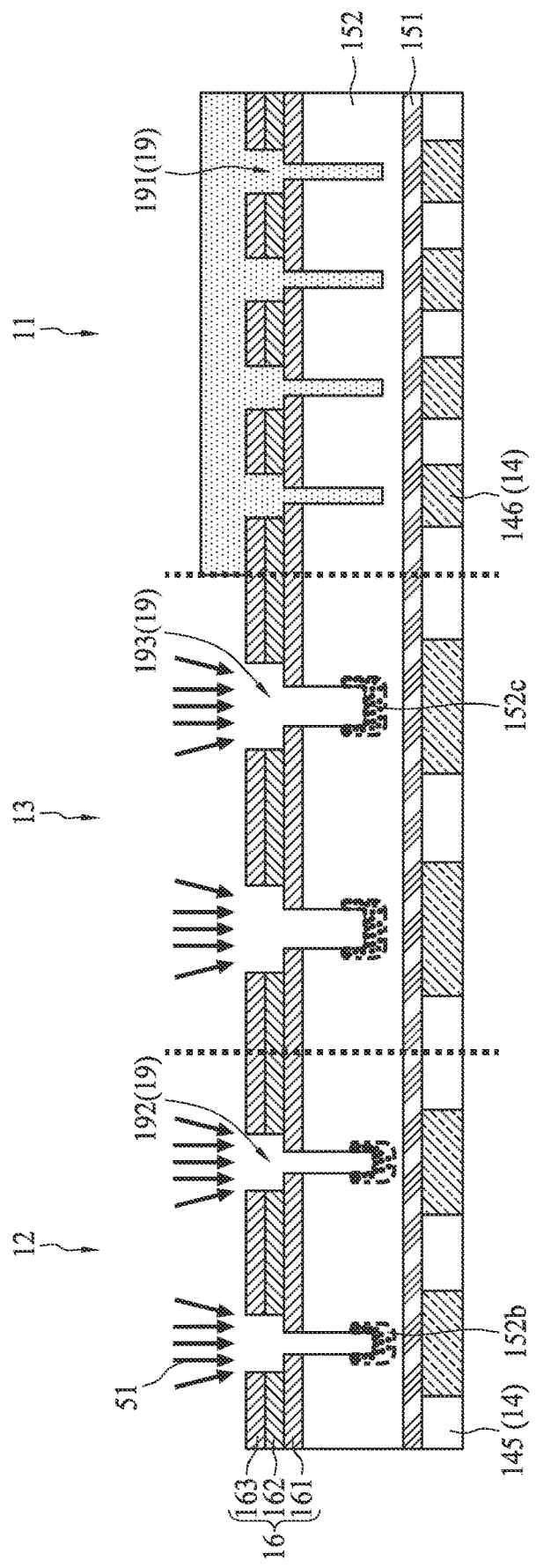

FIG. 23 is a schematic cross-sectional diagram along the line A-A' shown in FIG. 3 at a different stage of the method 600 and/or the method 700 according to some embodiments of the present disclosure. After exposure of the second openings 192 as shown in FIG. 22, the operation 603 of the method 600 and/or the operation 704 of the method 700 is performed. The amorphization 51 is performed, and the first dopant is introduced to a bottom portion of each of the third openings 193 in the third region 13 and a bottom portion of each of the second openings 192 in the second region 12 of the dielectric layer 152. The amorphization 51 is performed as described above, and repeated description is omitted herein.

Figure 24:
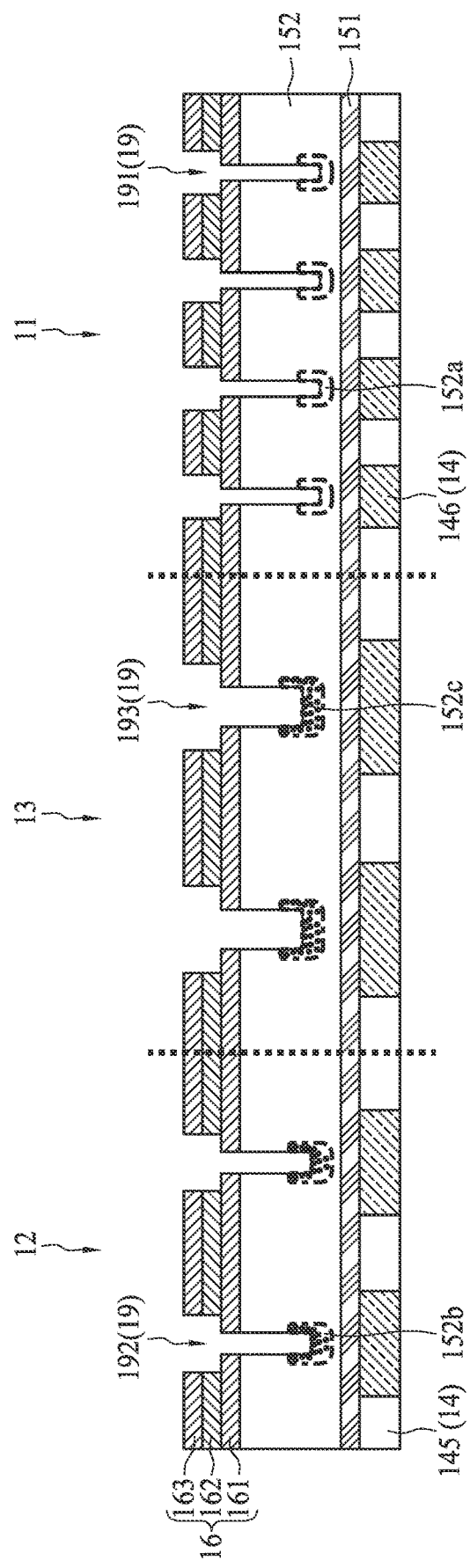

FIG. 24 is a schematic cross-sectional diagram along the line A-A' shown in FIG. 3 at a different stage of the method 600 and/or the method 700 according to some embodiments of the present disclosure. After the amorphization 51 is performed, the photoresist layer 23 is removed, and all of the openings 19 are exposed. The operation 604 of the method 600 and/or the operation 708 of the method 700 are then performed on the intermediate structure as shown in FIG. 24. Other operations as shown in FIGS. 15 to 18 are subsequently performed after the operation 604 of the method 600 and/or the operation 708 of the method 700, to form a structure similar to that shown in FIG. 18.

FIGS. 19 to 24 and their related paragraphs above illustrate an alternative embodiment to achieve a purpose of an even etching rate across different regions of the present disclosure. In the embodiments shown in FIGS. 4 to 18 and FIGS. 19 to 24, the third opening 193 undergoes two amorphizations. In other alternative embodiments, either the third opening 193 or the second opening 192 undergoes only one amorphization, but with different amounts of dopants introduced to the dielectric layer 152.

Figure 25:
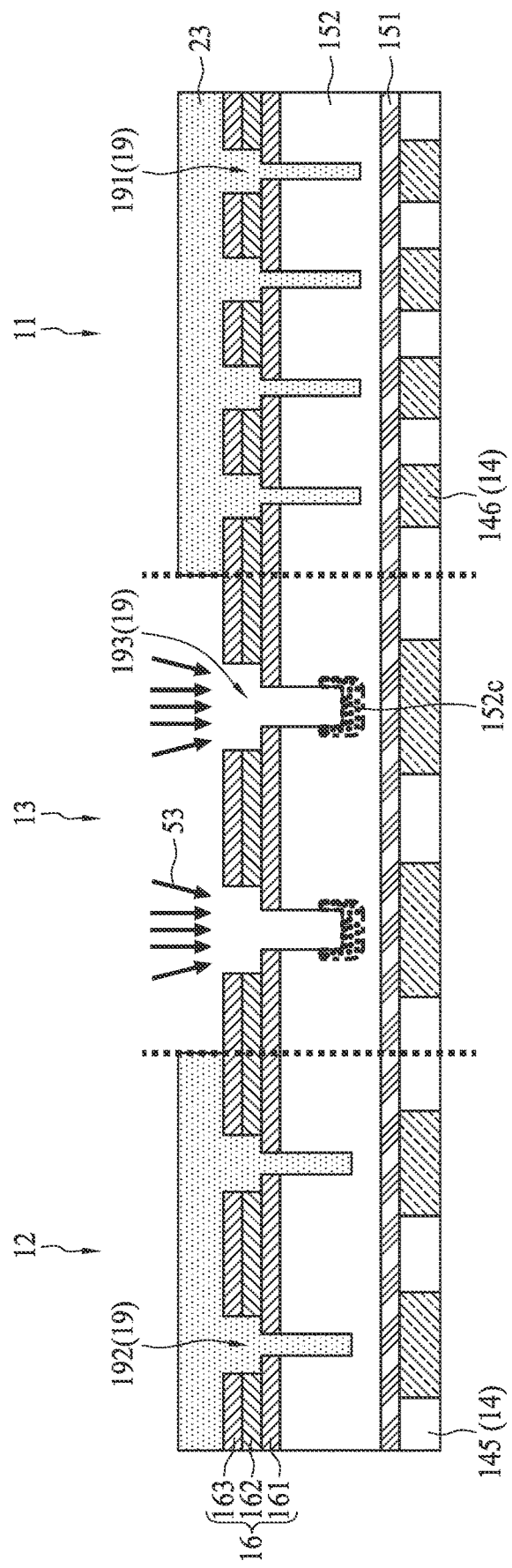
FIGS. 25 to 26 are schematic diagrams at different stages of a method for manufacturing a semiconductor structure in accordance with different embodiments of the disclosure.
Figure 26:
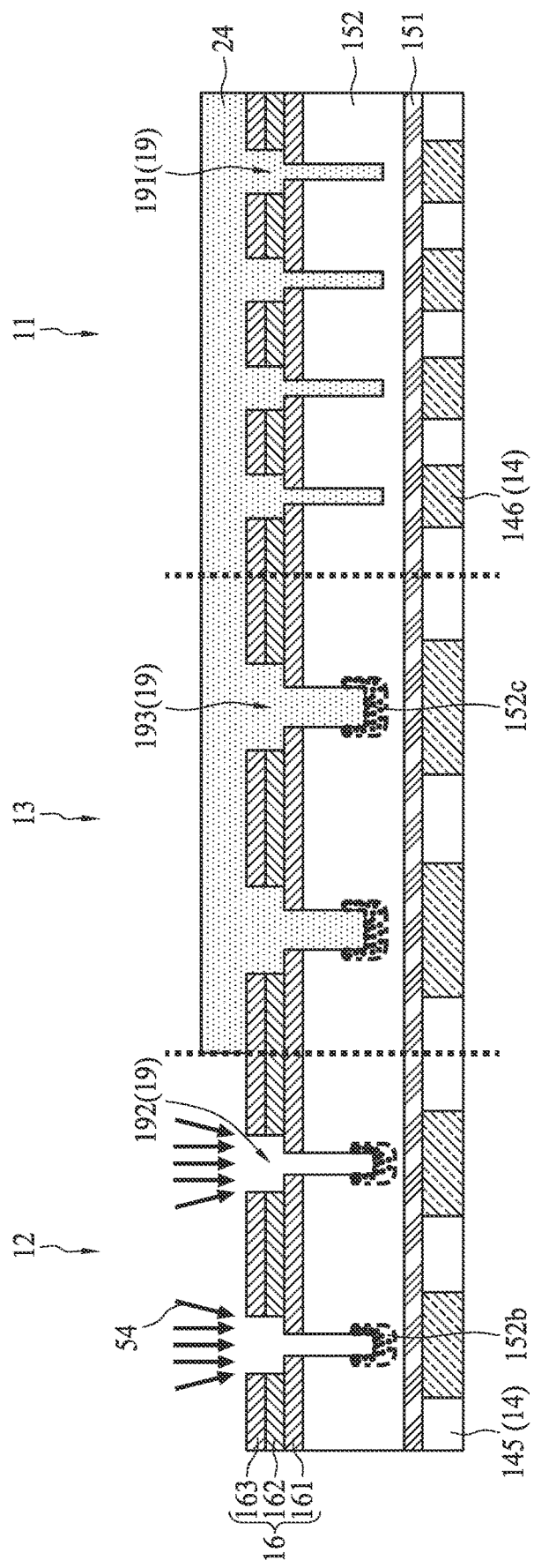
Figure 27:
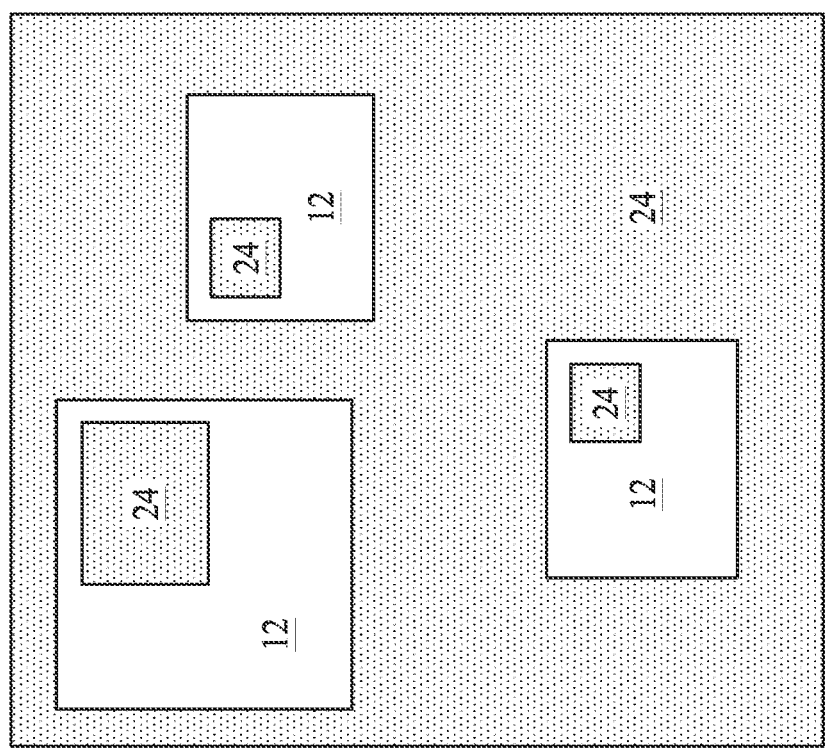
FIG. 27 is a schematic top view of a mask layer in accordance with some embodiments of the disclosure.

FIGS. 25 to 26 are schematic cross-sectional diagrams along the line A-A' shown in FIG. 3 at different stages of the method 600 and/or the method 700 according to some embodiments of the present disclosure, and FIG. 27 is a top view of a photoresist layer 24 used during the operation shown in FIG. 26. In some embodiments, the photoresist layer 23 is used during a amorphization 53 (or a third implantation) targeting bottoms of the third openings 193 in the third region as shown in FIG. 25. In some embodiments, a photoresist layer 24 shown in FIGS. 26 to 27 covering an entirety of the first openings 191 and an entirety of the third openings 193 is used during a amorphization 54 (or a fourth implantation) targeting bottoms of the second openings 192 in the second region 12. The amorphization 53 and the amorphization 54 may be performed for different durations and/or at different intensities in order to form a third region 152c and a second region 152b with different doping concentrations and/or different structural densities. In some embodiments, a duration of the amorphization 53 is greater than a duration of the amorphization 54. In some embodiments, an intensity of the amorphization 53 is greater than an intensity of the amorphization 54. The amorphization 53 can be performed prior to or after the amorphization 54, and a sequence is not limited herein as long as a same purpose can be achieved. Operations as shown in FIGS. 15 to 18 are subsequently performed on the intermediate structure of FIG. 26 to form a structure similar to that shown in FIG. 18.

Figure 28:
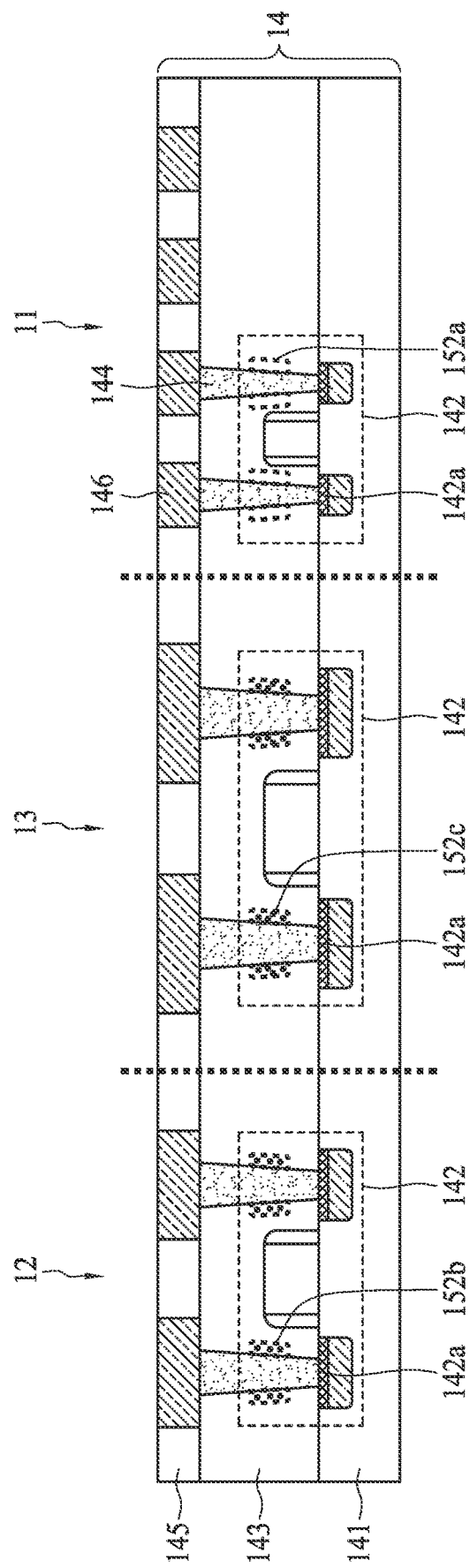
FIG. 28 is a schematic diagram at a stage of a method for manufacturing a semiconductor structure in accordance with different embodiments of the disclosure.

The method of the present disclosure can be applied in an interconnection structure disposed over electrical components 142 as illustrated above; however, the invention is not limited thereto. The method of the present disclosure can be applied in any stage of a semiconductor manufacturing process when uneven etching rates of trenches, openings or vias across different regions of a substrate are observed. For instance, the method can be applied in formation of contacts 144 as different regions may have different densities of the electrical components 142 and/or different densities of the contacts 144. FIG. 28 is a schematic cross-sectional diagram along the line A-A' shown in FIG. 3 at a stage of the method 600 and/or the method 700 according to some embodiments of the present disclosure. For ease of illustration and simplicity of drawing, only the contacts 144 connected to source/drain structures of the electrical components 142 are depicted. As shown in FIG. 28, the contacts 144 in different regions 11, 12 and 13 may have different sizes and/or densities. The method 600 or the method 700 of the present disclosure can be applied in the formation of the contacts 144, and the contacts 144 in different regions 11, 12 and 13 may be surrounded by different regions 152a, 152b and 152c with different doping concentrations. In some embodiments, the first region 152a is dopant-free, and a doping concentration of the second region 152b is less than a doping concentration of the third region 152c.

In accordance with some embodiments of the disclosure, a method for manufacturing a semiconductor structure is provided. The method may include several operations. A first layer is formed over a first region and a second region of a substrate. A first etching is performed on the first layer, thereby forming a first trench in the first region and a second trench in the second region. An amorphization 51 is performed on the first layer in the second region. A second etching is performed on the first layer, wherein an etching rate of the second etching in the second region is greater than an etching rate of the second etching in the first region.

In accordance with some embodiments of the disclosure, a method for manufacturing a semiconductor structure is provided. The method may include several operations. A dielectric layer is formed over a substrate. Portions of the dielectric layer are removed, thereby forming a first opening in a first region of the substrate, a second opening in a second region of the substrate, and a third opening in a third region of the substrate. A first mask layer is formed in the first region. A first dopant is introduced to a bottom of the second opening and a bottom of the third opening. A second mask layer is formed in the second region. A second dopant is introduced to the bottom of the third opening. The first mask layer and the second mask layer are removed. An etching is performed on the dielectric layer, thereby forming a first through via, a second through via and a third through via.

In accordance with some embodiments of the disclosure, a semiconductor structure is provided. The structure includes a dielectric layer, a first through via, a second through via, and a third through via. The dielectric layer is disposed in an interconnect structure, and includes a first doping region and a second doping region, wherein a first doping concentration of the first doping region is different from a second doping concentration of the second doping region. The first through via is surrounded by a dopant-free region of the dielectric layer. The second through via is surrounded by the first doping region. The third through via is surrounded by the second doping region.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a first layer over a substrate, wherein the first layer has a first region, a second region and a third region;
    performing a first etching with a first etching rate on the first layer, thereby forming a first trench in the first layer in the first region, a second trench in the first layer in the second region, and a third trench in the first layer in the third region;
    performing a first amorphization on the first layer in the second region to form a second layer;
    performing a second amorphization on the first layer in the third region; and
    performing a second etching on the second layer with a second etching rate, wherein the second etching rate in the first region or the second region is greater than the first etching rate in the same region.

2. The method of claim 1, wherein the first trench is one of a plurality of first trenches, the second trench is one of a plurality of second trenches, and a density of the plurality of first trenches in the first region is greater than a density of the plurality of second trenches in the second region.

3. The method of claim 1, wherein a width of the first trench is less than a width of the second trench from a cross-sectional perspective.

4. The method of claim 1, further comprising:
    forming a first mask layer covering the first region prior to the first amorphization.

5. The method of claim 4, further comprising:
    forming a second mask layer covering the second region prior to the second amorphization.

6. The method of claim 1, wherein the second etching targets a bottom of the third trench.

7. The method of claim 1, further comprising:
    forming a conductive material in the first trench and the second trench, wherein the conductive material is electrically connected to a conductive element of the substrate.

8. A method for manufacturing a semiconductor structure, comprising:
    forming a dielectric layer over a substrate;
    removing portions of the dielectric layer, thereby forming a first opening in a first region, a second opening in a second region and a third opening in a third region;
    forming a first mask layer in the first region;
    introducing a first dopant to a bottom of the second opening and a bottom of the third opening;
    forming a second mask layer in the second region;
    introducing a second dopant to the bottom of the third opening;
    removing the first mask layer and the second mask layer; and
    performing an etching on the dielectric layer, thereby forming a first through via, a second through via and a third through via.

9. The method of claim 8, further comprising:
    depositing a conductive material in the first through via, the second through via and the third through via after the performing of the etching on the dielectric layer.

10. The method of claim 9, wherein a first doping region is formed by the introduction of the first dopant, and the first doping region surrounds the conductive material in the second through via.

11. The method of claim 9, wherein a second doping region is formed by the introduction of the first dopant and the introduction of the second dopant, and the second doping region surrounds the conductive material in the third through via.

12. The method of claim 8, wherein a distance between the first opening and a fourth opening in the first region is less than a distance between the second opening and a fifth opening in the second region from a cross-sectional perspective.

13. The method of claim 12, wherein the distance between the second opening and the fifth opening in the second region is less than a distance between the third opening and a sixth opening in the third region from a cross-sectional perspective.

14. The method of claim 8, wherein the second dopant is same as the first dopant.

15. The method of claim 8, wherein the first dopant includes carbon (C), silicon (Si), germanium (Ge), tin (Sn), lead (Pb), boron (B), aluminum (Al), gallium (Ga), indium (In), thallium (Tl), nitride (N), phosphorus (P), arsenic (As), antimony (Sb), bismuth (Bi), or a combination thereof.

16. The method of claim 9, wherein the conductive material includes copper (Cu), aluminum (Al), tungsten (W), manganese (Mn), cobalt (Co), titanium (Ti), or a combination thereof.

17. A method for manufacturing a semiconductor structure, comprising:
    forming a first opening and a second opening separated from each other in a dielectric layer;
    forming a first doped region surrounding a bottom of the first opening in the dielectric layer;
    forming a second doped region surrounding a bottom of the second opening in the dielectric layer; and
    forming a first through via in the first opening and a second through via in the second opening,
    wherein the first doped region comprises a first dopant, the second doped region comprises a second dopant same as the first dopant, and a doping concentration of the second doped region is greater than a doping concentration of the first doped region.

18. The method of claim 17, wherein a width of the second opening is greater than a width of the first opening.

19. The method of claim 17, wherein a depth of the first opening is greater than a depth of the second opening.

20. The method of claim 17, further comprising:
    forming a third opening separated from the first opening and the second opening in the dielectric layer; and
    forming a third through via in the third opening, wherein the third through via is surrounded by a dopant-free region.

* * * * *